(12) United States Patent
Siew et al.

(10) Patent No.: US 9,768,025 B2
(45) Date of Patent: Sep. 19, 2017

(54) SEMICONDUCTOR DEVICE AND METHOD OF FABRICATING THE SAME

(71) Applicants: Yongkong Siew, Suwon-si (KR); Sung-Yup Jung, Hwaseong-si (KR)

(72) Inventors: Yongkong Siew, Suwon-si (KR); Sung-Yup Jung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/184,491

(22) Filed: Jun. 16, 2016

(65) Prior Publication Data
US 2017/0125248 A1    May 4, 2017

(30) Foreign Application Priority Data

Nov. 2, 2015  (KR) .......................... 10-2015-0153257

(51) Int. Cl.
*H01L 21/311*  (2006.01)
*H01L 21/033*  (2006.01)

(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
USPC ................................................ 438/695, 696
See application file for complete search history.

(56) References Cited

U.S. PATENT DOCUMENTS

| 7,452,825 | B2 | 11/2008 | Lee et al. |
| 8,216,938 | B2 | 7/2012 | Lee et al. |
| 8,431,329 | B2 | 4/2013 | Bae et al. |
| 8,889,561 | B2 | 11/2014 | Woo et al. |
| 8,969,215 | B2 | 3/2015 | Sim et al. |
| 8,987,008 | B2 | 3/2015 | Shieh et al. |
| 8,999,848 | B2 | 4/2015 | Lee et al. |
| 9,035,431 | B2 | 5/2015 | Cheng et al. |
| 9,093,378 | B2 | 7/2015 | Kim et al. |
| 2009/0001044 | A1* | 1/2009 | Chung ............... H01L 21/0338 216/11 |
| 2009/0246706 | A1 | 10/2009 | Hendel et al. |

(Continued)

FOREIGN PATENT DOCUMENTS

| JP | 2014072226 A | 4/2014 |
| KR | 100763538 | 9/2007 |

(Continued)

*Primary Examiner* — Roberts Culbert
(74) *Attorney, Agent, or Firm* — Volentine & Whitt, PLLC

(57) ABSTRACT

A method of fabricating a semiconductor device includes forming a target layer on a substrate, forming a plurality of reference patterns at uniform intervals on the target layer, forming a plurality of spacers on the side surfaces of the reference patterns, forming a plurality of filling patterns in spaces left between the spacers, forming a surface-modified filling pattern by performing a first surface treatment on a portion of the plurality of filling patterns, forming a surface-modified reference pattern by performing a second surface treatment on a portion of the plurality of reference patterns, and removing the plurality of filling patterns and the plurality of reference patterns and leaving the surface-modified filling pattern and the surface-modified reference pattern on the target layer.

20 Claims, 40 Drawing Sheets

(56) References Cited

U.S. PATENT DOCUMENTS

2012/0103935 A1 5/2012 Cheng et al.
2014/0083972 A1 3/2014 Oyama et al.
2015/0024597 A1 1/2015 Gao et al.
2015/0035081 A1 2/2015 Cheng et al.

FOREIGN PATENT DOCUMENTS

| KR | 1020090049524 | 5/2009 |
| KR | 1020110002796 | 1/2011 |
| KR | 1020120035387 | 4/2012 |
| KR | 1020120035398 | 4/2012 |
| KR | 1020140113254 | 9/2014 |

\* cited by examiner

SEMICONDUCTOR DEVICE AND METHOD OF FABRICATING THE SAME

PRIORITY STATEMENT

This application claims the benefit of Korean Patent Application No. 10-2015-0153257, filed on Nov. 2, 2015, in the Korean Intellectual Property Office, the disclosure of which is hereby incorporated by reference in its entirety.

BACKGROUND

The inventive concept relates to a semiconductor device and to a method of fabricating the same. More particularly, the inventive concept relates to a method of fabricating a semiconductor device which includes a plurality of line patterns extending parallel to each other.

With the recent trend of producing lighter, thinner, shorter, and smaller electronic products, demand for fine patterning of a semiconductor device is increasing. Thus, a fine pattern forming technology, such as a double patterning technology (DPT), or a quadruple patterning technology (QPT), is being developed. However, it is difficult to form fine-width line separation patterns for separating extremely fine line patterns.

SUMMARY

According to an aspect of the inventive concept, there is provided a method of fabricating a semiconductor device, which includes: forming a target layer on a substrate, forming a plurality of reference patterns on the target layer, wherein the reference patterns are spaced at uniform intervals from one another, forming a plurality of spacers covering both side surfaces of each of the reference patterns, forming a plurality of filling patterns filling spaces between the spacers, performing a first surface treatment on a portion of the plurality of filling patterns to form a surface-modified filling pattern, performing a second surface treatment on a portion of the plurality of reference patterns to form a surface-modified reference pattern, and removing the plurality of filling patterns and the plurality of reference patterns without removing the surface-modified filling pattern and the surface-modified reference pattern.

According to another aspect of the inventive concept, there is provided a method of fabricating a semiconductor device, which includes: forming a hard mask layer including a first material on a substrate; forming a plurality of reference patterns including a second material on the hard mask layer; forming a plurality of spacers including a third material on both side surfaces of each of the plurality of reference patterns on the hard mask layer; forming a plurality of filling patterns including a fourth material on the hard mask layer, the plurality of filling patterns filling a space between two neighboring spacers among the plurality of spacers; forming a surface-modified reference pattern or a surface-modified filling pattern by surface-treating a portion of the plurality of reference patterns or a portion of the plurality of filling patterns; and removing the plurality of reference patterns and the plurality of filling patterns such that the surface-modified reference pattern or the surface-modified filling pattern and the plurality of spacers are not removed.

According to still another aspect of the inventive concept, there is provided a method of fabricating a semiconductor device, which includes: forming a target layer on a substrate; forming a plurality of reference patterns repeated according to a constant reference pitch on the target layer, the plurality of reference patterns extending in a first direction parallel to an upper surface of the substrate; forming a plurality of spacers covering both side surfaces of each of the plurality of reference patterns; forming a plurality of filling patterns filling a space between two neighboring spacers among the plurality of spacers; forming a surface-treated reference pattern by performing a first surface treatment on a portion of the plurality of reference patterns; forming a surface-treated filling pattern by performing a second surface treatment on a portion of the plurality of filling patterns; removing the plurality of filling patterns and the plurality of reference patterns such that the surface-treated reference pattern and the surface-treated filling pattern are not removed; forming a plurality of line patterns by etching the target layer using, as an etch mask, the surface-treated reference pattern, the surface-treated filling pattern and the plurality of spacers, such that the plurality of line patterns includes a first line pattern having a first width along a second direction and a second line pattern having a second width, which is different from the first width, along the second direction, the second direction being parallel to the upper surface of the substrate and perpendicular to the first direction.

According to still another aspect of the inventive concept, there is provided a method of fabricating a semiconductor device, which includes: forming a plurality of reference patterns on an upper surface of an etch target, wherein the reference patterns are spaced apart from each other in a first direction parallel to the upper surface of the etch target and such that each of the reference patterns has opposite side surfaces in the first direction, forming a plurality of spacers on the plurality of reference patterns, wherein the spacers cover the side surfaces of the reference patterns, respectively, and such that spaces are left between respective ones of the spacers adjacent to one another in the first direction, forming a plurality of filling patterns in the spaces between said respective ones of the spacers such that a respective pair of the spacers is located on opposite sides of each of the filling patterns in the first direction, selectively treating a portion of said patterns to form at least one modified pattern spanning respective parts of two of the spacers adjacent to each other in the first direction, removing those portions of the filling patterns and the reference patterns which have not been treated to form said at least one modified pattern, without removing the spacers and each said at least one modified pattern, and subsequently etching the etch target using the spacers and each said at least one modified pattern together as an etch mask.

According to still another aspect of the inventive concept, there is provided a method of fabricating a semiconductor device, which includes: forming a plurality of linear reference patterns on an upper surface of an etch target using a photolithography process, wherein the linear reference patterns are spaced apart from each other in a first direction and each of the linear reference patterns extends longitudinally in a second direction perpendicular to the first direction, forming linear spacers that extend along opposite side surfaces of the reference patterns, respectively, forming linear filling patterns within spaces between respective ones of the linear spacers wherein the linear spacers together constitute a first line and space pattern and the linear reference patterns and the linear filling patterns together constitute a second line and space pattern, selectively treating a portion of the second line and space pattern to form at least one modified pattern that spans respective parts of two of the spacers adjacent to one another in the first direction, removing those portions of the linear filling patterns and the linear reference patterns which have not been treated to form each at least one modified pattern, without removing the linear spacers and each at least one modified pattern, and subsequently etching the etch target using the linear spacers and the at least one modified pattern together as an etch mask to form a target pattern in which linear spaces aligned in the second direction are separated by a portion of the target pattern.

According to yet another aspect of the inventive concept, there is provided a semiconductor device which includes a plurality of line patterns on a substrate, the plurality of line patterns extending in a first direction parallel to an upper surface of the substrate, wherein the plurality of line patterns includes a first line pattern and a second line pattern, which extend in a straight line along the first direction and are spaced apart from each other with a line separation pattern therebetween, and the first line pattern, the second line pattern, and the line separation pattern have the same width along a second direction that is parallel to the upper surface of the substrate and different from the first direction.

BRIEF DESCRIPTION OF THE DRAWINGS

The inventive concept will be more clearly understood from the following detailed description taken in conjunction with the accompanying drawings in which:

FIGS. 2A to 12B illustrate a method of fabricating a semiconductor device according to examples of the inventive concept, wherein FIGS. 2A, 3A, 4A, 5A, 6A, 7A, 8A, 9A, 10A, 11A, and 12A are plan views of a semiconductor device during the course of its manufacture, and FIGS. 2B, 3B, 4B, 5B, 6B, 7B, 8B, 9B, 10B, 11B, and 12B are cross-sectional views taken along lines B-B' of FIGS. 2A, 3A, 4A, 5A, 6A, 7A, 8A, 9A, 10A, 11A, and 12A, respectively

DETAILED DESCRIPTION

Figure 1:
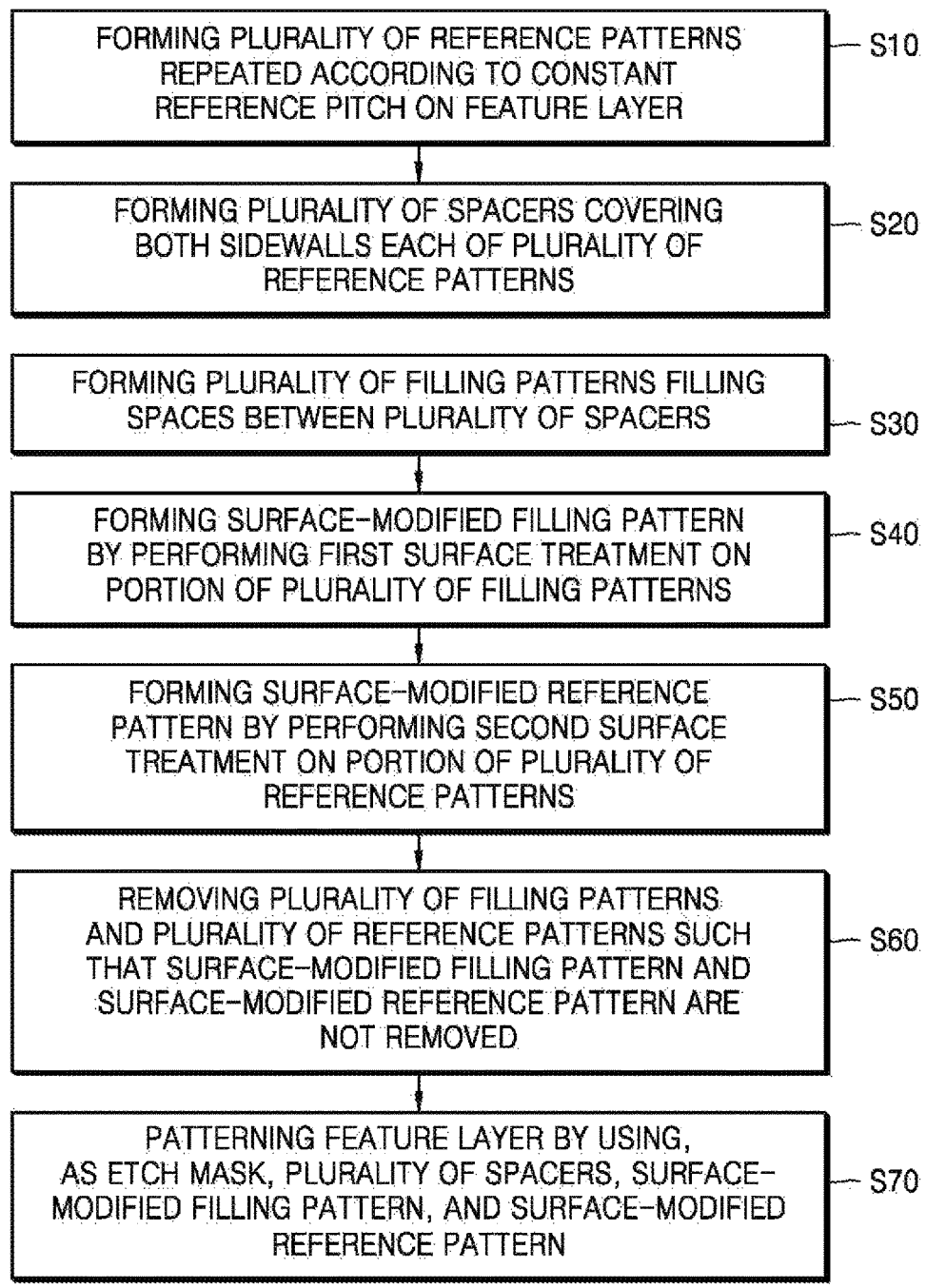
FIG. 1 is a flowchart of a method of fabricating a semiconductor device according to examples of the inventive concept.

Examples of the inventive concept will be described in detail with reference to the accompanying drawings. It should be understood that the inventive concept is not limited to the following examples and may be realized in different ways, and that the examples are provided for complete disclosure and thorough understanding of the inventive concept by those skilled in the art. In the drawings, the sizes of components may be exaggerated for convenience.

It will be understood that when a component is referred to as being placed "on" another element, it can be directly placed on the other element, or an intervening layer(s) may also be present. On the other hand, when a component is referred to as being directly placed "on" another element, an intervening layer(s) is not present. Other expressions explaining a relationship between components, such as "between components" and "directly between components", can be interpreted likewise.

It will also be understood that although the terms such as "first", "second" and the like may be used herein to describe various components, these components should not be limited by these terms. These terms may be used only to distinguish one component from another component. For example, a first component could be termed a second component without departing from the scope of the inventive concept, and a second component could also be termed a first component likewise.

As used herein, the singular terms "a," "an" and "the" are intended to include the plural forms as well, unless the context clearly indicates otherwise. It will be understood that the terms such as "comprises", "comprising", "includes", "including", "has", and "having", when used herein, specify the presence of stated features, numbers, steps, operations, components, parts, or combinations thereof, but do not preclude the presence or addition of one or more other features numbers, steps, operations, components, parts, or combinations thereof. Also, when an element is described as "including" one particular material, such a description does not necessarily imply that the element has another type(s) of material in addition to that one particular material.

Unless otherwise defined, terms used herein can be interpreted as meanings generally known to those of ordinary skill in the art or as will be plainly understood in the context of the art to which the inventive concept pertains. For example, the term "pattern" may at times be used to describe an individual feature formed as a result of some process of patterning a layer of material and at other times may be used to describe a series of individual features formed as a result of a patterning process or processes, as the context will make clear. The term "width" when used to refer to a dimension of a pattern, though, will be used to refer to the width of an individual feature and not the collective width of several features constituting a pattern, as the drawings will make clear. The term "height" may be used synonymously with the term thickness and will generally refer to a dimension in the vertical direction in the orientation shown in the drawings. The term "extending" will generally be used to refer to the longitudinal direction or reference the longest dimension of an element or feature especially in the case of line-shaped (i.e., linear) elements or features.

As used herein, the term "and/or" includes any and all combinations of one or more of the associated listed items. Expressions such as "at" least one of when preceding a list of elements, modify the entire list of elements and do not modify the individual elements of the list.

FIG. 1 is a flowchart of a method of fabricating a semiconductor device according to examples of the inventive concept.

FIGS. 2A to 12B are plan views and cross-sectional views shown according to a process order in order to explain a method of fabricating a semiconductor device according to examples of the inventive concept. FIGS. 2B, 3B, 4B, 5B, 6B, 7B, 8B, 9B, 10B, 11B, and 12B respectively show cross-sectional views taken along a line B-B' of FIGS. 2A, 3A, 4A, 5A, 6A, 7A, 8A, 9A, 10A, 11A, and 12A.

A method of fabricating a semiconductor device using a double patterning technology (DPT) will be described with reference to FIGS. 1 and 2A to 12B.

Figure 2A:
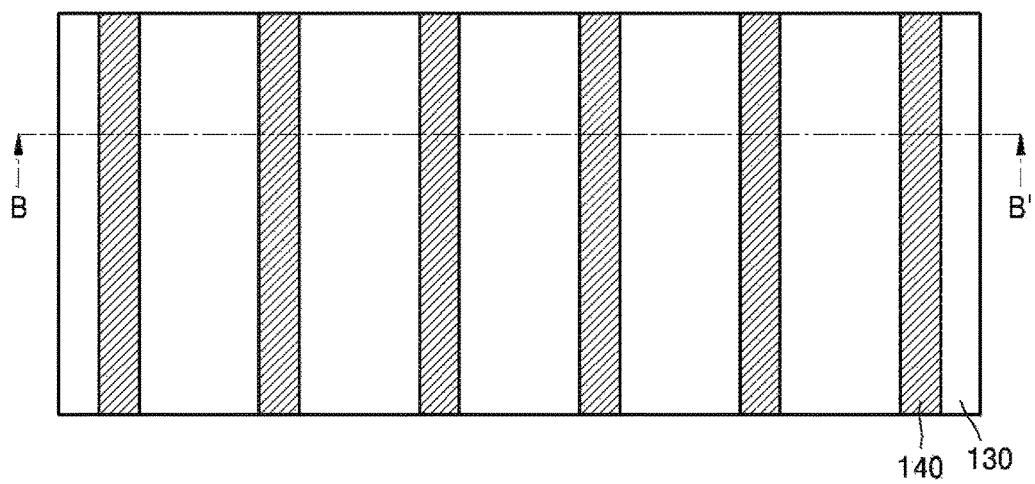
Figure 2B:
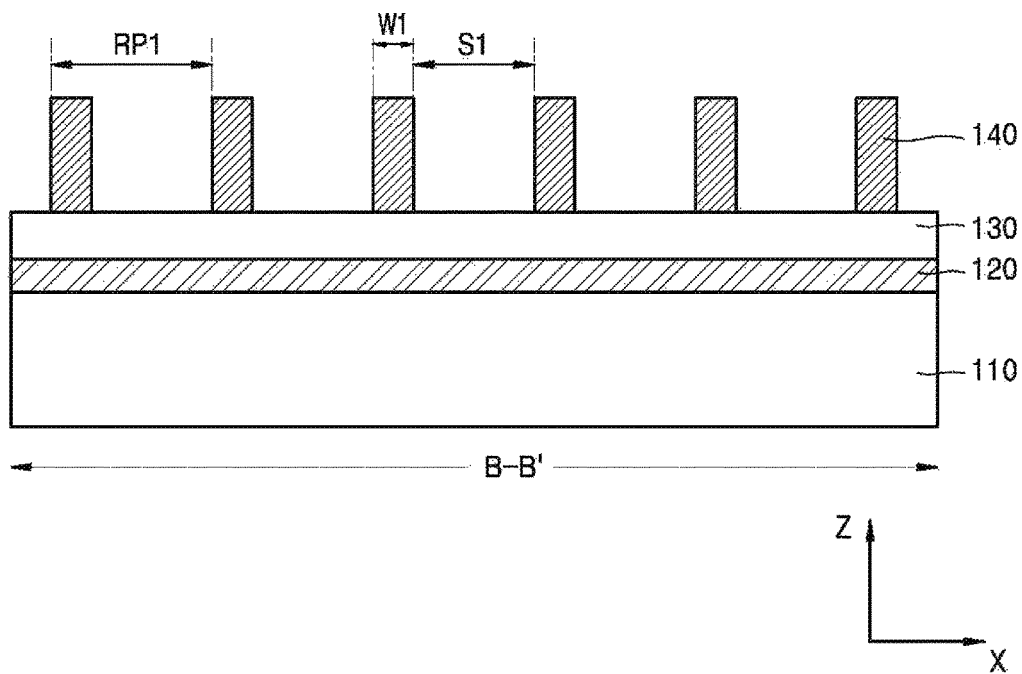

Referring to FIGS. 1, 2A, and 2B, in an operation S10, a plurality of reference patterns 140 repeated according to a constant reference pitch may be formed on an etch target, e.g., a feature layer.

First, the feature layer may be formed on a substrate 110.

The substrate 110 may include a semiconductor substrate. In examples of the inventive concept, the substrate 110 may include a semiconductor such as Si or Ge. In other examples of the inventive concept, the substrate 110 may include a compound semiconductor such as SiGe, SiC, GaAs, InAs, or InP. In yet other examples of the inventive concept, the substrate 110 may have a silicon on insulator (SOI) structure. The substrate 110 may include a conductive region, for example, an impurity-doped well, or an impurity-doped structure. In addition, the substrate 110 may have various device isolation structures such as a shallow trench isolation (STI) structure.

The feature layer may be a stacked structure of a target layer 120 and a hard mask layer 130. However, the feature layer is not limited to the stacked structure of the target layer 120 and the hard mask layer 130, and an additional material layer (not shown) may be further formed between the target layer 120 and the hard mask layer 130, or between the substrate 110 and the target layer 120, as needed.

In examples of the inventive concept, the target layer 120 may include an insulating material or a conductive material. For example, the target layer 120 may include a metal, an alloy, a metal carbide, a metal oxynitride, a metal oxycarbide, a semiconductor, polysilicon, oxide, nitride, oxynitride, a hydrocarbon compound, or combinations thereof, without being limited thereto. In addition, the target layer 120 may include the same material as the substrate 110, and may also include a different material from the substrate 110. When including a different material, the target layer 120 and the substrate 110 may have an equal or similar etch rate, or may also have a different etch rate. For example, the target layer 120 may be an insulating interlayer which includes a plurality of insulating layers including at least one of flowable oxide (FOX), high density plasma (HDP) oxide, tonen silazene (TOSZ), spin on glass (SOG), and undoped silica glass (USG).

In examples of the inventive concept, the hard mask layer 130 may include an insulating material or a conductive material. For example, the hard mask layer 130 may include a metal, an alloy, a metal carbide, a metal oxynitride, a metal oxycarbide, a semiconductor, polysilicon, oxide, nitride, oxynitride, a hydrocarbon compound, or combinations thereof, without being limited thereto. The hard mask layer 130 may include a material having a sufficient etch selectivity with respect to the target layer 120. For example, the hard mask layer 130 may be formed to a certain thickness using titanium or titanium nitride.

Next, reference patterns 140 repeated according to a constant reference pitch RP1 along a first direction (X direction) may be formed on the hard mask layer 130.

The plurality of reference patterns 140 may include a material having an etch selectivity with respect to the feature layer (or the hard mask layer 130) and to a liner (not shown) for spacer formation, which will be formed in a subsequent process. In examples of the inventive concept, the plurality of reference patterns 140 may include amorphous silicon. However, the plurality of reference patterns 140 is not limited to the examples set forth above.

In examples of the inventive concept, to form the plurality of reference patterns 140, a preliminary layer for forming the plurality of reference patterns 140 is formed on the hard mask layer 130, followed by forming a photoresist pattern (not shown) on the preliminary layer by a photolithography process, and then etched using the photoresist pattern as an etch mask, thereby leaving the plurality of reference patterns 140 on the hard mask layer 130.

In examples of the inventive concept, the reference pitch RP1 may be determined according to a minimum feature size of the semiconductor device. Here, the reference pitch RP1 refers to a sum of a first width W1 of (each of the) reference patterns 140 and a first space Si between neighboring reference patterns 140. When the minimum feature size of the semiconductor device is 1F, the reference pitch RP1 may be 4F. Alternatively, when the minimum feature size of the semiconductor device is 1F, the reference pitch RP1 may be less than 4F. In examples of the inventive concept, the first width W1 of the reference pattern 140 may range from about 10 nanometers to about 100 nanometers, without being limited thereto.

Figure 3A:
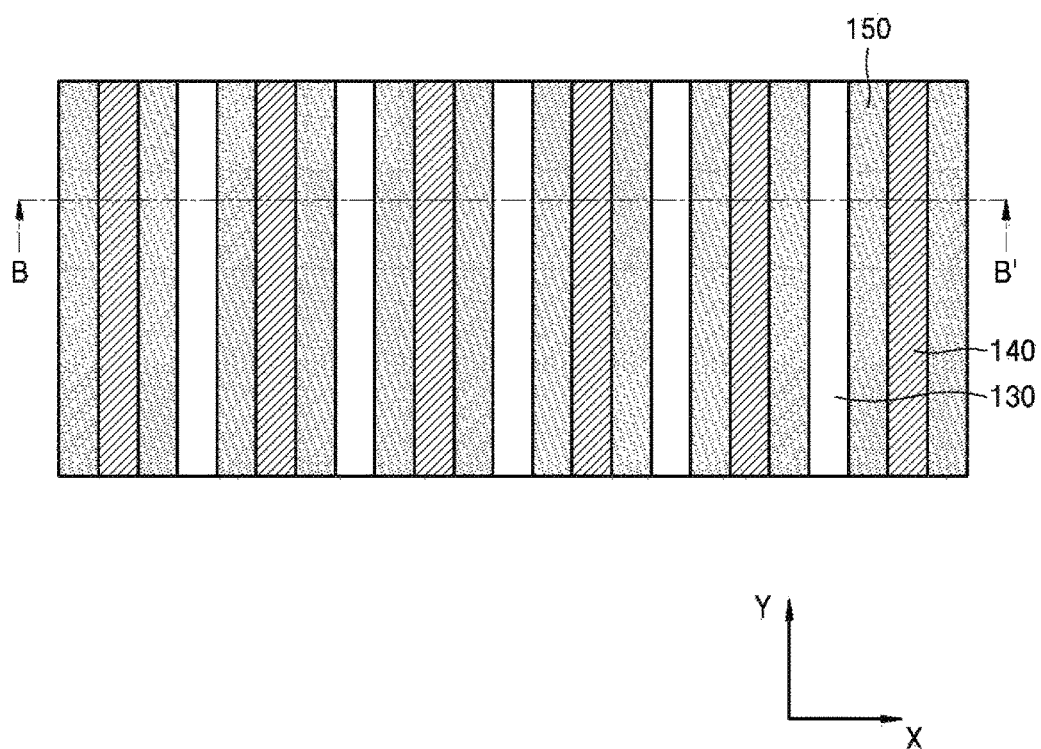
Figure 3B:
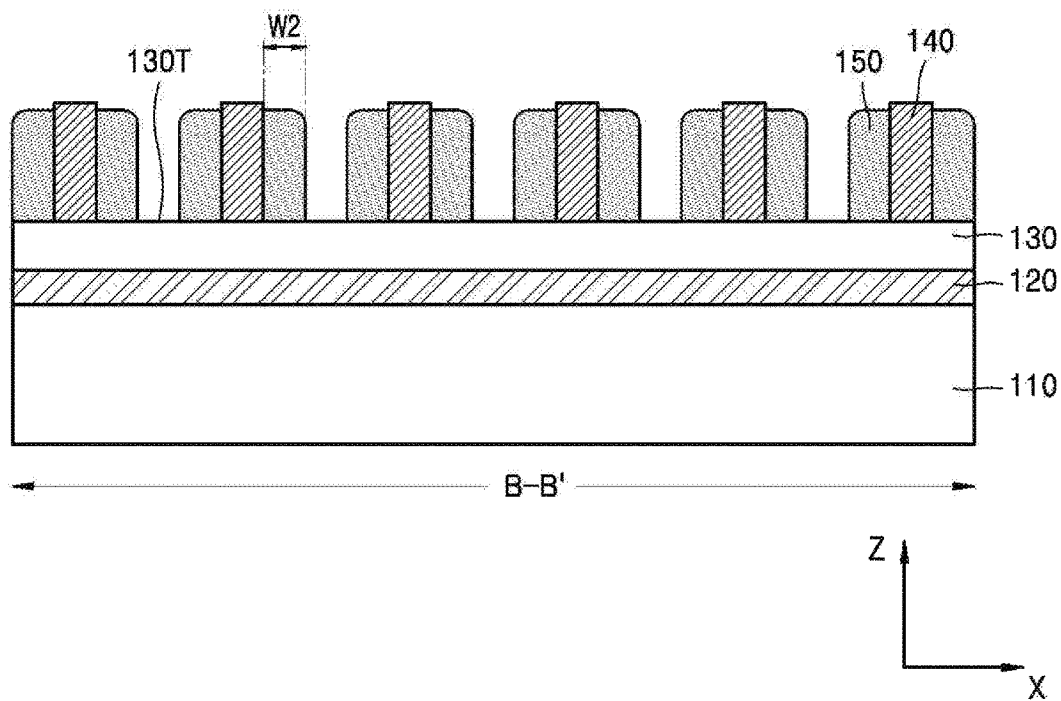

Referring to FIGS. 1, 3A, and 3B, in an operation S20, a plurality of spacers 150 covering both side surfaces of each of the plurality of reference patterns 140 may be formed.

In examples of the inventive concept, a liner (not shown) for spacer formation, which has a uniform thickness and covers exposed surfaces of the reference patterns 140 and exposed surfaces of the hard mask layer 130, is formed, followed by performing etch back of the liner for spacer formation such that an upper surface of each of the plurality of reference patterns 140 and a portion of an upper surface 130T of the hard mask layer 130 are exposed, thereby leaving the plurality of spacers 150 as a residual portion of the liner for spacer formation.

The plurality of spacers 150 may include a material having an etch selectivity with respect to the hard mask layer 130, the plurality of reference patterns 140, and a plurality of filling patterns 160 (see FIGS. 4A and 4B) that will be formed in a subsequent process. In examples of the inventive concept, the plurality of spacers 150 may include silicon nitride or silicon oxynitride. However, the inventive concept is not limited thereto.

A second width W2 of (each of) the spacers 150 in the first direction (X direction) may be determined according to the minimum feature size of the semiconductor device. For example, when the minimum feature size of the semiconductor device is 1F, the second width W2 of the spacer 150 in the first direction (X direction) may be 1F. However, the inventive concept is not limited thereto. In examples of the inventive concept, the second width W2 of the spacer 150 may range from about 10 nanometers to about 100 nanometers, without being limited thereto.

Figure 4A:
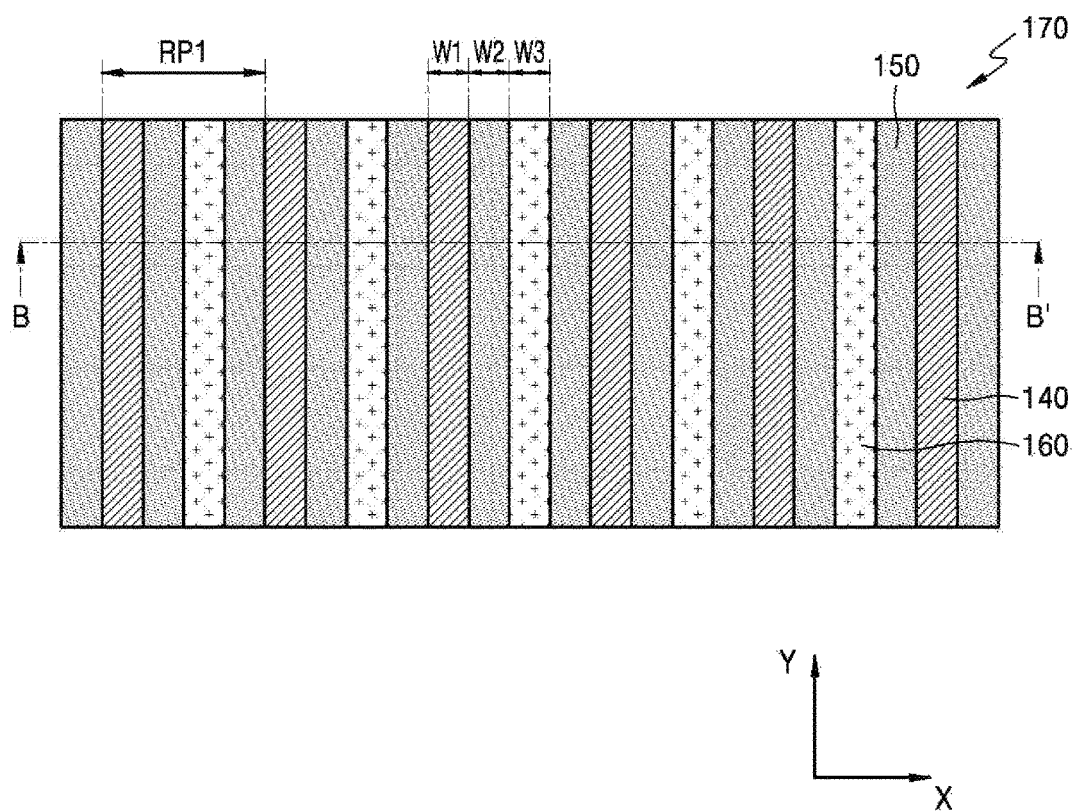
Figure 4B:
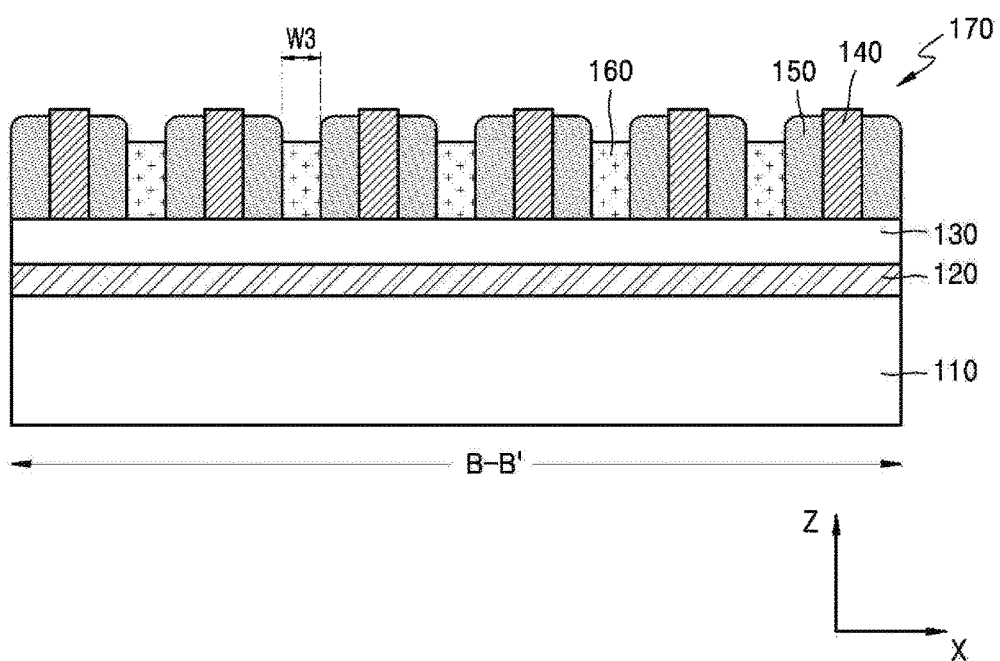
Figure 5A:
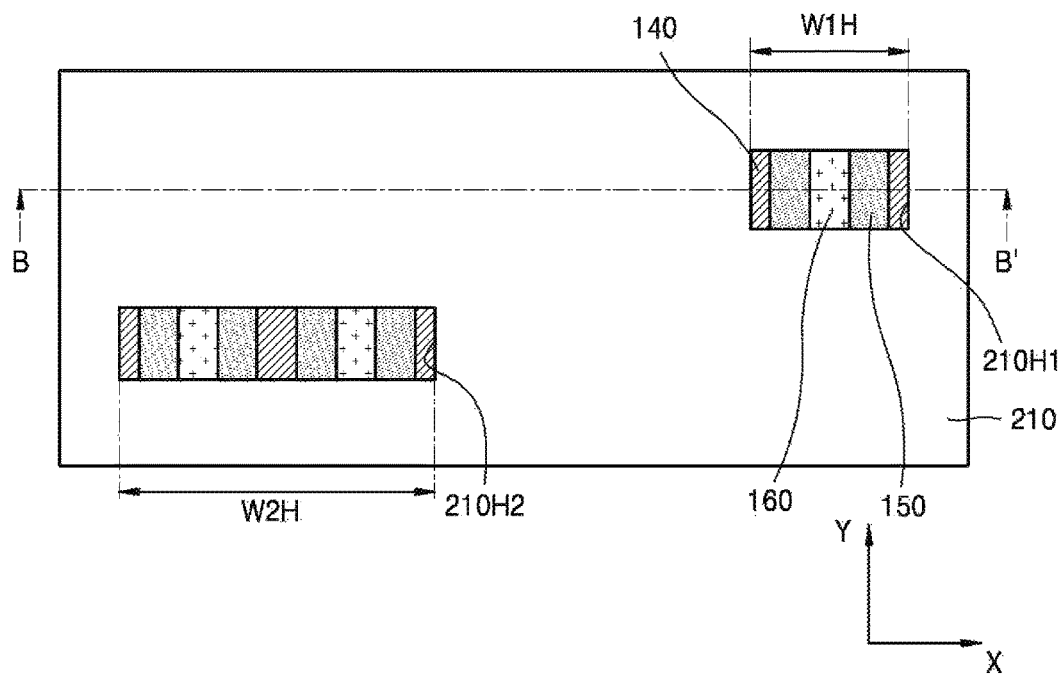
Figure 5B:
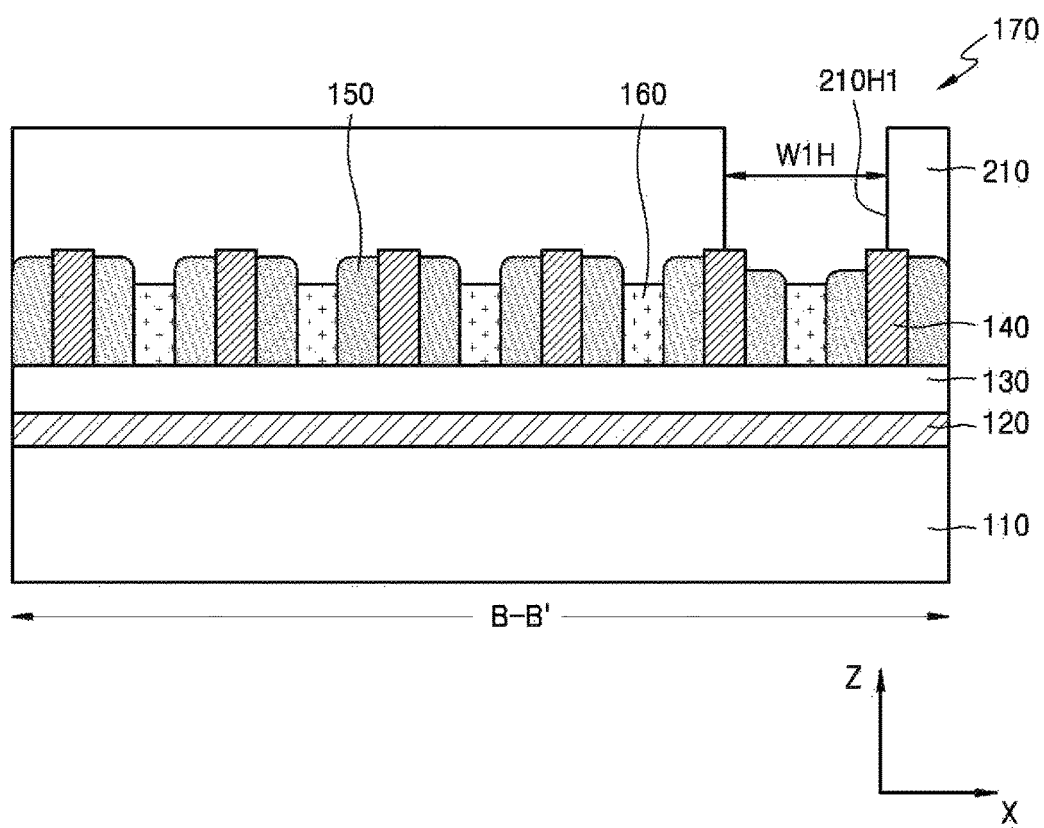

Referring to FIGS. 1, 4A, and 4B, in an operation S30, a plurality of filling patterns 160 filling spaces between the spacers 150 may be formed.

In examples of the inventive concept, to form the plurality of filling patterns 160, as shown in FIG. 3B, a filling layer (not shown), which covers the exposed surfaces of the reference patterns 140 and exposed surfaces of the hard mask layer 130, is formed to a uniform thickness, followed by performing etch back of the filling layer such that the upper surface of each of the plurality of reference patterns 140 is exposed, thereby leaving the plurality of filling patterns 160 as residual portions of the filling layer. In the etch back process, upper portions of the filling patterns 160 may be further removed such that the plurality of filling patterns 160 has an upper surface which is at a lower level than the upper surfaces of the reference patterns 140 and/or the spacers 150. Thus, an upper portion of each of the plurality of reference patterns 140 may protrude upwards beyond the plurality of filling patterns 160 by a certain amount. However, the inventive concept is not limited thereto.

In examples of the inventive concept, the plurality of filling patterns 160 may include a carbon-based material layer. For example, the plurality of filling patterns 160 may include an amorphous carbon layer (ACL) or a spin-on hardmask (SOH) material. The SOH material may include a hydrocarbon compound or derivatives thereof, which have a relatively high carbon content of about 85% by weight (wt %) to about 99 wt % based on the total weight of the SOH material. However, the inventive concept is not limited thereto.

In a process for forming the plurality of filling patterns 160 using the SOH material, an organic compound layer having a thickness of about 1000 Å to about 5000 Å may be formed on the plurality of reference patterns 140, the plurality of spacers 150, and the hard mask layer 130 by a spin coating process or the like. The organic compound may include a hydrocarbon compound or derivatives thereof including an aromatic ring, such as phenyl, benzene, or naphthalene. The organic compound may include a material having a relatively high carbon content of about 85 wt % to about 99 wt % based on the total weight of the organic compound. A carbon-containing layer may be formed by performing a first bake of the organic compound layer at a temperature of about 150° C. to about 350° C. The first bake may be performed for about 30 seconds to about 300 seconds. Next, the carbon-containing layer may be cured by performing a second bake thereof at a temperature of about 300° C. to about 550° C. for about 30 seconds to about 300 seconds. The carbon-containing layer is cured by performing a baking process thereof twice, whereby even though a deposition process is performed at a relatively high temperature of about 400° C. or more when another material is formed on the carbon-containing layer, the carbon-containing layer may not be damaged during the deposition process. However, a process for forming the plurality of filling patterns 160 is not limited thereto.

A third width W3 of (each of) the filling patterns 160 in the first direction (X direction) may be determined according to a minimum feature size of the semiconductor device. For example, when the minimum feature size of the semiconductor device is 1F, the third width W3 of the filling pattern 160 in the first direction may be 1F. However, the inventive concept is not limited thereto. In examples of the inventive concept, the third width W3 of the filling pattern 160 may range from about 10 nanometers to about 100 nanometers, without being limited thereto.

As shown in FIGS. 4A and 4B, a mold pattern 170 including the plurality of reference patterns 140, the plurality of spacers 150, and the plurality of filling patterns 160 may be formed on the hard mask layer 130. On the hard mask layer 130, the each of the reference patterns 140 may extend along a second direction (Y direction), each of the spacers 150 may be formed on a respective one of the side surfaces of the reference patterns 140 and extend along the second direction, and each of the filling patterns 160 may extend along the second direction while filling a space between two spacers 150 facing each other between two neighboring reference patterns 140.

In the mold pattern 170, the plurality of reference patterns 140, the plurality of spacers 150, the plurality of filling patterns 160, and the plurality of spacers 150, each of which extends along the second direction (Y direction), may be sequentially arranged side by side along the first direction (X direction). Here, the reference pitch RP1 may be a sum of the width W1 of the reference patterns 140, twice the width W2 of the spacers 150, and the width W3 of the filling patterns 160 (that is, RP1=W1+2W2+W3) as all taken in the first direction.

Thus, in an example of the mold pattern 170 according to the inventive concept, the spacers 150 may together constitute a first line and space pattern, and the reference patterns 140 and the filling patterns 160 may together constitute a second line and space pattern discrete from the first line and space pattern.

The first width W1 of the reference patterns 140, the second width W2 of the spacers 150, and the third width W3 of the filling patterns 160 may be variously selected according to a kind and required properties of the semiconductor device, a material of the hard mask layer 130, a material of the target layer 120, etc.

In examples of the inventive concept, when the minimum feature size of the semiconductor device is 1F, the second width W2 of the spacers 150 may be 1F, the first width W1 of the reference patterns 140 and the third width W3 of the filling patterns 160 may each be 1F, and the reference pitch RP1 may be 4F.

In other examples of the inventive concept, when the minimum feature size of the semiconductor device is 1F, the second width W2 of the spacers 150 may be 1F, the first width W1 of the reference patterns 140 and the third width W3 of the filling patterns 160 may each be less than 1F, and the reference pitch RP1 may be less than 4F. For example, the second width W2 of the spacers 150 may be 1F, the first width W1 of the reference patterns 140 and the third width W3 of the filling patterns 160 may each be 0.75F, and the reference pitch RP1 may be 3.5F.

In yet other examples of the inventive concept, when the minimum feature size of the semiconductor device is 1F, the second width W2 of the spacers 150 may be greater than 1F, the first width W1 of the reference patterns 140 and the third width W3 of the filling patterns 160 may each be 1F, and the reference pitch RP1 may be greater than 4F. For example, the second width W2 of the spacers 150 may be 1.25F, the first width W1 of the reference patterns 140 and the third width W3 of the filling patterns 160 may each be 1F, and the reference pitch RP1 may be 4.5F. However, the first to third widths W1, W2, W3 are not limited to the examples set forth above.

Next, a selective treatment process (S40 and/or S50) of selectively treating a portion of the reference and filling patterns 140 and 160, according to the inventive concept, to alter the same and thereby form at least one modified pattern will be described in detail.

Referring to FIGS. 1 and 5A to 6B, in an operation S40, a surface-modified filling pattern 160A may be formed by performing a first surface treatment S110 on a portion of the plurality of filling patterns 160.

First, a first mask layer 210 including first openings 210H1 exposing a portion of the plurality of filling patterns 160 is formed.

In examples of the inventive concept, the first mask layer 210 may include a spin-on dielectric (SOD) material or a low temperature oxide (LTO) material. In a process for forming the first mask layer 210, an insulating layer (not shown) may be formed on the mold pattern 170 by a spin coating process or a chemical vapor deposition (CVD) using an SOD material or an LTO material, and a photoresist mask may be formed on the insulating layer. Next, the first mask layer 210 may be formed by patterning the insulating layer using the photoresist mask as an etch mask.

In examples of the inventive concept, the first opening 210H1 may have a first width W1H, and, for example, the first width W1H may range from 20 nanometers to 200 nanometers. When the minimum feature size of the semiconductor device is 1F, the first width W1H of the first opening 210H1 may be greater than 2F and equal to or less than 4F. However, the inventive concept is not limited thereto.

In examples of the inventive concept, the first opening 210H1 may expose a portion of the upper surface of a filling pattern 160, and a portion of upper surfaces of the spacers 150 located on both sides of the filling pattern 160. The first opening 210H1 may also expose portions of upper surfaces of the reference patterns 140 located on respective sides of the exposed spacers 150.

The portion of the upper surfaces of the plurality of filling patterns 160, exposed by the first openings 210H1, may act as an etch mask (not shown) for forming a line separation pattern 130S (see FIGS. 11A and 11B) which separates a first line pattern space 120L1 of a plurality of line pattern spaces 120L1, 120L2 (see FIGS. 11A and 11B) from a second line pattern space 120L2 that is spaced apart from the first line pattern space 120L1 in the second direction (Y direction).

In examples of the inventive concept, the first mask layer 210 may further include second openings 210H2. Each second opening 210H2 may have a second width W2H, which is greater than the width W1H of the first opening 210H1, in the first direction (X direction). For example, the second width W2H may range from 40 nanometers to 400 nanometers, without being limited thereto. Portions of upper surfaces of two neighboring filling patterns 160 may be exposed by the second opening 210H2. In addition, upper surfaces of the spacers 150 on both sides of each of the neighboring filling patterns 160, and the upper surface of the reference pattern 140 interposed between neighboring ones of the spacers 150, may be exposed.

Next, the surface-modified filling pattern 160A may be formed by performing the first surface treatment S110 on the exposed portion of the plurality of filling patterns 160.

In a process for forming the surface-modified filling pattern 160A, an upper portion of the filling patterns 160 exposed by the first opening 210H1 and the second opening 210H2 may be densified by performing the first surface treatment S110 on the mold pattern 170, thereby forming an upper filling pattern 160U. A lower portion of the filling pattern 160, which is not densified by the first surface treatment S110, may be referred to as a lower filling pattern 160L. Thus, the surface-treated filling pattern 160A may include the lower filling pattern 160L including an SOH material or an ACL material, and the upper filling pattern 160U which is located on the lower filling pattern 160L and includes a densified SOH material or a densified ACL material.

In examples of the inventive concept, the first surface treatment S110 may be an ion implantation process for implanting silicon ions, germanium ions, and/or metal impurity ions. For example, the ion implantation process may be performed at an incident angle of about 0 degrees to about 40 degrees with respect to a third direction (Z direction) perpendicular to an upper surface of the first mask layer 210 using an ion implantation energy of about 10 keV to 180 keV. For example, the ion implantation process may be performed at a dose of about $1 \times 10^{14}$ ions/cm$^2$ to about $5 \times 10^{15}$ ions/cm$^2$. However, the inventive concept is not limited thereto.

In other examples of the inventive concept, the first surface treatment S110 may be a plasma process using at least one of argon (Ar), nitrogen (N$_2$), helium (He), krypton (Kr), and xenon (Xe). For example, the plasma process may be an Ar plasma process. The plasma process may be performed at a temperature of about 100° C. to about 400° C. using a plasma power of about 200 W to about 20 kW. However, the inventive concept is not limited thereto.

In examples of the inventive concept, the upper filling pattern 160U may have a second height H2 (or thickness) that is less than about 50% of a first height H1 (or thickness) of the filling pattern 160 along the third direction (Z direction). However, the second height H2 is not limited thereto.

In examples of the inventive concept, the upper filling pattern 160U may include an SOH material or an ACL material having a material content that is from that of the lower filling pattern 160L. For example, when the first surface treatment S110 is ion implantation for implanting silicon, germanium, and/or metal ions, the upper filling pattern 160U may include an SOH material including silicon, germanium, and/or metal ions in a certain amount. However, the inventive concept is not limited thereto. Alternatively, when the first surface treatment S110 is a plasma process, the upper filling pattern 160U may include the same material as the lower filling pattern 160L, and a degree of densification (or a density) of the upper filling pattern 160U may be greater than a degree of densification of the lower filling pattern 160L.

In examples of the inventive concept, an upper portion of the plurality of reference patterns 140 exposed by the first opening 210H1 and the second opening 210H2 may not be densified by the first surface treatment S110. For example, the plurality of reference patterns 140 may include amorphous silicon, and a surface of the amorphous silicon may be hardly influenced by the first surface treatment S110. In addition, an upper portion of the plurality of spacers 150 exposed by the first opening 210H1 and the second opening 210H2 may also not be densified by the first surface treatment S110. For example, the plurality of spacers 150 may include a silicon nitride layer, and the silicon nitride layer may be a relatively dense material layer as compared with the SOH material layer or the ACL material layer. Thus, the silicon nitride layer may be may be hardly influenced by the first surface treatment S110 for densifying the SOH material layer or the ACL material layer.

Next, the first mask layer 210 may be removed.

Upper portions of the spacers 150 and upper portions of the filling patterns 160, which are exposed by the first and second openings 210H1, 210H2, may be removed as much as a certain height by forming of the first mask layer 210, which includes the first and second openings 210H1, 210H2, and/or by the first surface treatment S110. Thus, heights of the portions of the plurality of spacers 150 and the plurality of filling patterns 160 which are not covered by the first mask layer 210 (that is, which are exposed by the first and second openings 210H1, 210H2) may be less than heights of portions of the plurality of spacers 150 and the plurality of filling patterns 160 which are covered by the first mask layer 210.

Figure 6A:
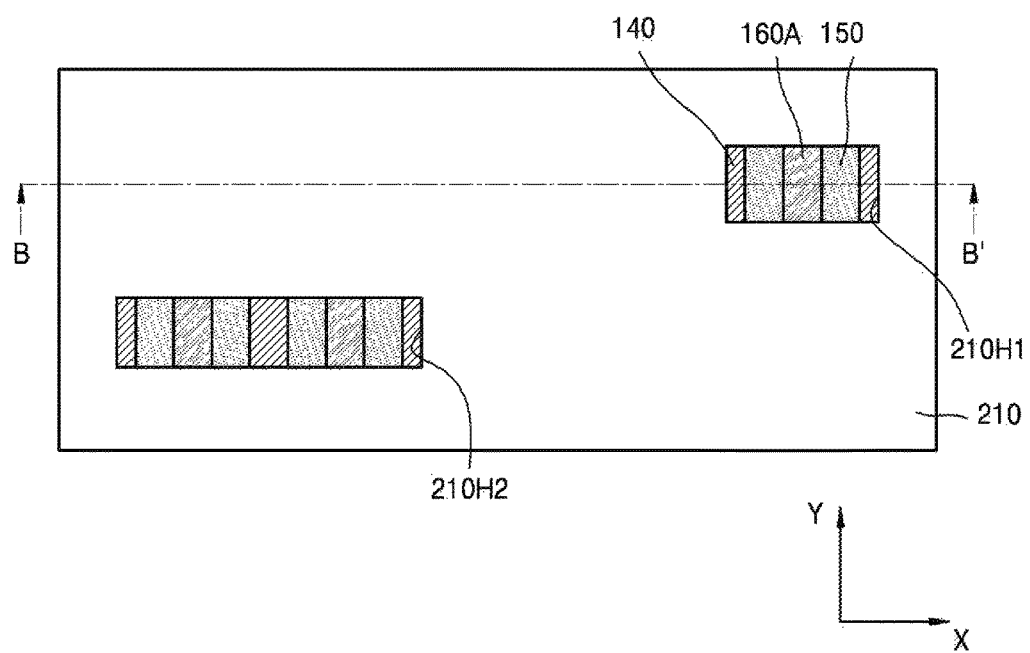
Figure 6B:
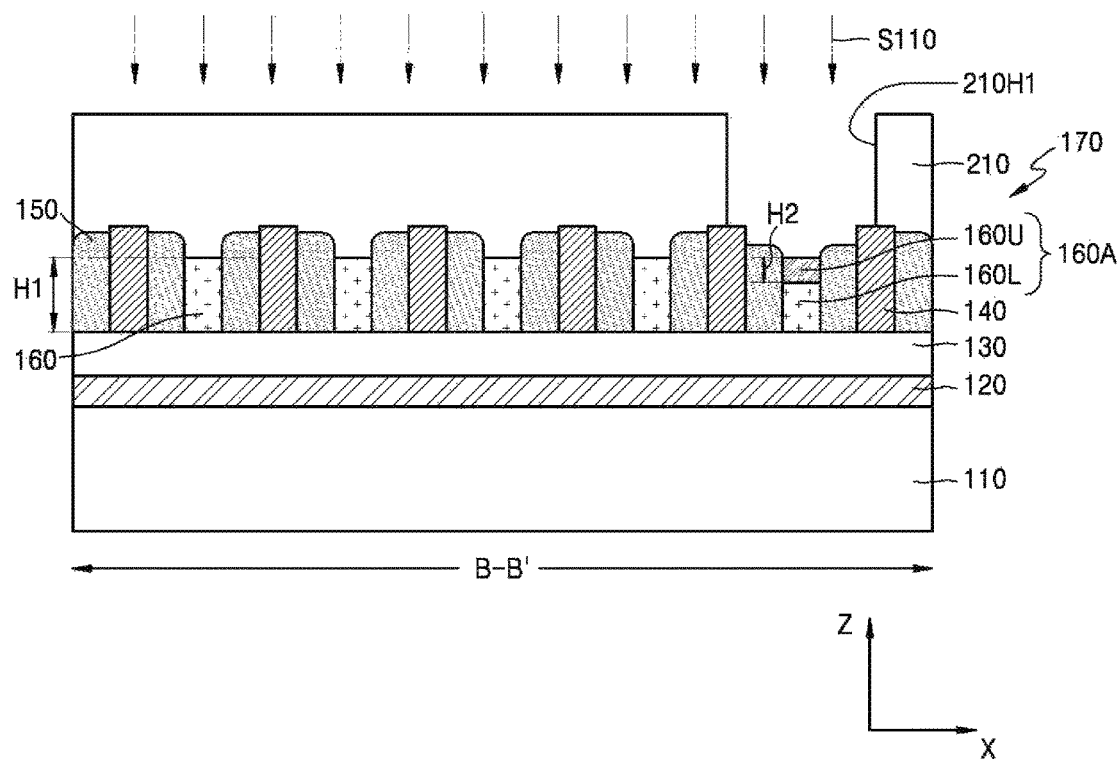
Figure 7A:
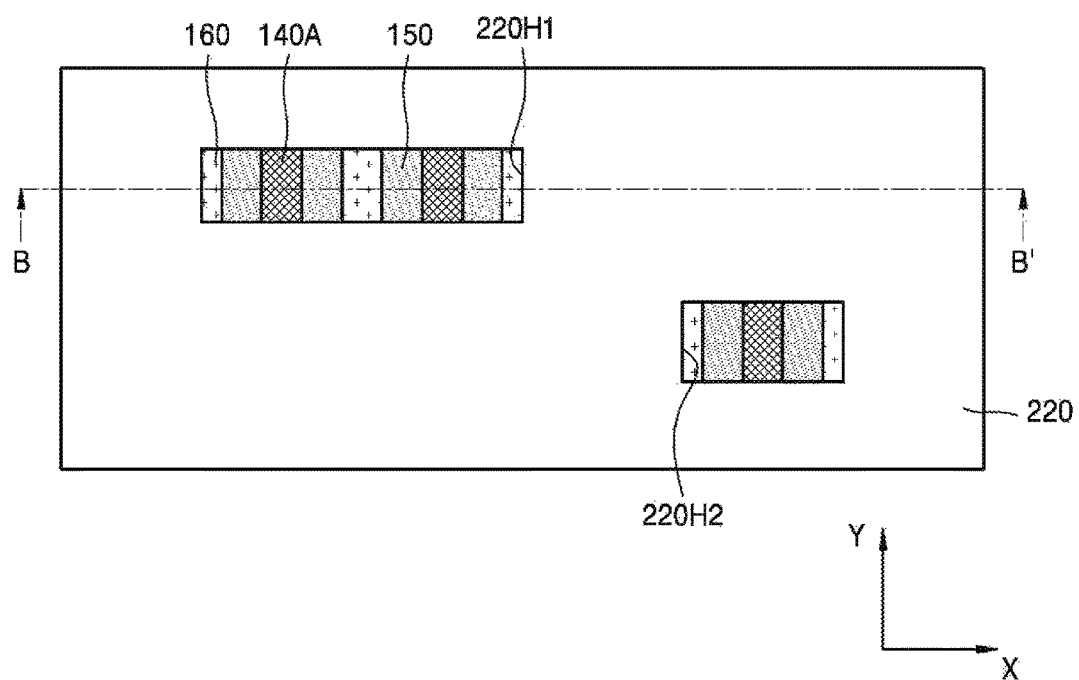
Figure 7B:
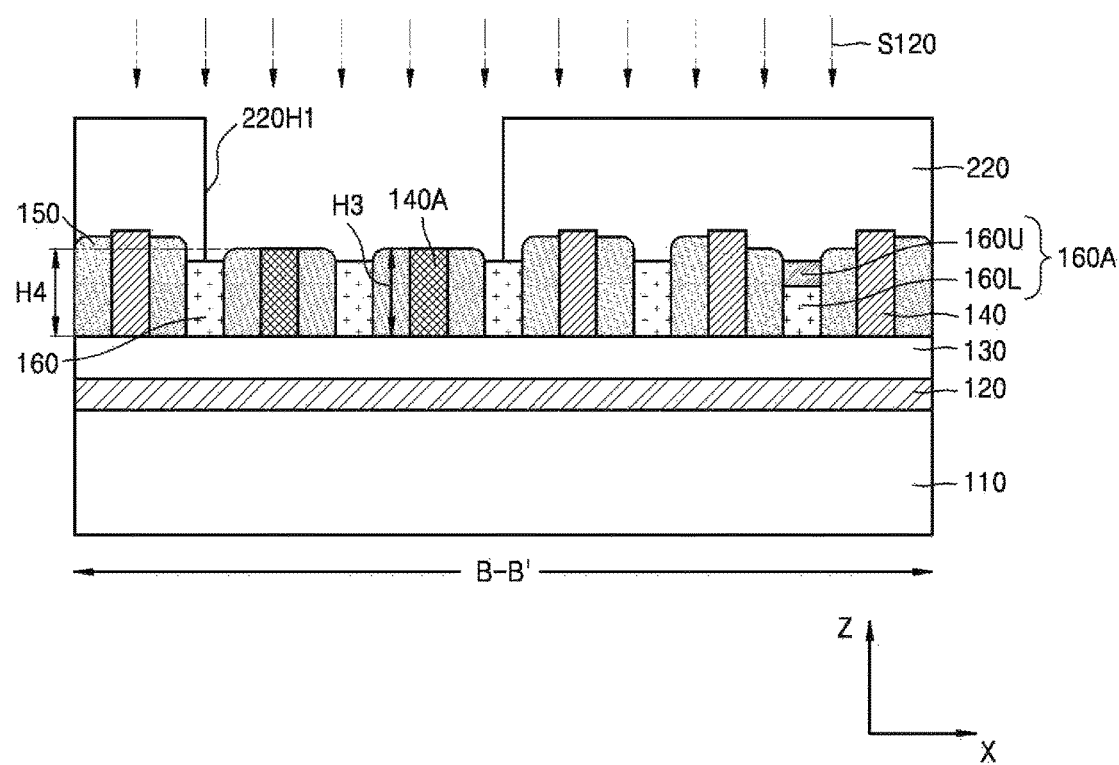

Referring to FIGS. 1, 7A, and 7B, in an operation S50, a surface-modified reference pattern 140A may be formed by performing a second surface treatment S120 on a portion of the reference pattern 140 (see FIGS. 6A and 6B).

In a process for forming the surface-modified reference pattern 140A, a second mask layer 220 including a third opening 220H1 and a fourth opening 220H2 may be formed on the mold pattern 170, followed by nitriding a portion of the plurality of reference patterns 140 which is exposed by the third opening 220H1 and the fourth opening 220H2.

In examples of the inventive concept, the second mask layer 220 may include an SOD material or an LTO material. In a process for forming the second mask layer 220, an insulating layer (not shown) may be formed by a spin coating process, a chemical vapor deposition (CVD) process, or the like using an SOD material or an LTO material, and a photoresist layer may be formed on the insulating layer. Next, the second mask layer 220 may be formed by patterning the insulating layer using the photoresist layer as an etch mask.

In examples of the inventive concept, the second surface treatment S120 may be a plasma process using ammonia ($NH_3$) and/or a nitrogen oxide ($N_2O$). For example, the plasma process may be performed at a temperature of about 100° C. to about 500° C. using a plasma power of about 50 W to about 300 W. However, the inventive concept is not limited thereto. Nitrogen atoms may penetrate into the portion of the reference pattern 140 exposed by the third and fourth openings 220H1 and 220H2 and including amorphous silicon, and thus, the surface-modified reference pattern 140A may include silicon nitride ($SiN_x$).

In examples of the inventive concept, the surface-modified reference pattern 140A may have an etch rate that is equal to or similar to that of the plurality of spacers 150. For example, the plurality of spacers 150 may include silicon nitride, and surface modification may be performed such that the reference pattern 140A is converted into silicon nitride by the plasma process. In addition, the surface-modified reference pattern 140A may include a material having an etch selectivity with respect to the plurality of reference patterns 140 (that is, the surface-modified reference pattern 140A and the plurality of reference patterns 140 may have a different etch rate from each other). In this case, in a subsequent process for removing the plurality of reference patterns 140, the surface-modified reference pattern 140A may not be removed, and may serve as an etch mask (not shown) in a process of forming a line separation pattern 130S for separating line patterns.

In other examples of the inventive concept, the second surface treatment S120 may be a plasma process using oxygen ($O_2$) and/or carbon monoxide (CO) in conjunction with ammonia ($NH_3$) and/or a nitrogen oxide ($N_2O$). For example, the plasma process may be performed at a temperature of about 100° C. to about 500° C. using a plasma power of about 50 W to about 300 W. However, the inventive concept is not limited thereto. Nitrogen atoms and oxygen atoms may penetrate into the portion of the reference pattern 140 exposed by the third and fourth openings 220H1 and 220H2 and including amorphous silicon, and thus, the surface-modified reference pattern 140A may include silicon oxynitride ($SiN_xO_y$).

In yet other examples of the inventive concept, the second surface treatment S120 may be an ion implantation process for implanting nitrogen ions into the reference pattern 140. For example, the ion implantation process may be performed at an incident angle of about 0 degrees to about 40 degrees with respect to the third direction (Z direction) perpendicular to an upper surface of the second mask layer 220 and using an ion implantation energy of about 10 keV to 180 keV. For example, the ion implantation process may be performed at a dose of about $1 \times 10^{14}$ ions/cm$^2$ to about $5 \times 10^{15}$ ions/cm$^2$. However, the inventive concept is not limited thereto.

Optionally, after the second surface treatment S120 is performed, a heat treatment may be performed on the mold pattern 170. The heat treatment may be performed at a temperature of about 200° C. to about 500° C. For example, nitrogen atoms present at a relatively high concentration in an upper portion of the surface-modified reference pattern 140A directly after the second surface treatment S120 may be sufficiently diffused into the surface-modified reference pattern 140A, and thus, the surface-modified reference pattern 140A may have a relatively uniform concentration of nitrogen atoms substantially throughout the total height (thickness) thereof. However, the inventive concept is not limited thereto.

Portions of the plurality of spacers 150 and portions of the plurality of filling patterns 160, which are exposed by the third and fourth openings 220H1, 220H2 may not be damaged by the second surface treatment S120. For example, when the second surface treatment S120 is a plasma process using at least one of ammonia (NH3), a nitrogen oxide ($N_2O$), oxygen ($O_2$), and carbon monoxide (CO), the plurality of spacers 150 may be hardly nitrided by the plasma process since the plurality of spacers 150 includes silicon nitride. The carbon-containing layer is cured by performing a baking process twice in the process for forming the plurality of filling patterns 160, whereby the carbon-containing layer may not be nitrided during the plasma process even though the plasma process is applied to an exposed surface of carbon-containing layer. In addition, when the second surface treatment S120 is a nitrogen ion implantation process, an ion implantation energy or a dose in the ion implantation process may be appropriately selected such that portions of the plurality of filling patterns 160 exposed by the third and fourth openings 220H1, 220H2 are not densified while nitrogen ions are sufficiently implanted into the reference pattern 140.

Upper portions of the spacers 150 and upper portions of the reference patterns 140, which are exposed by the third and fourth openings 220H1 and 220H2, may be removed by forming of the second mask layer 220, which includes the third and fourth openings 220H1 and 220H2, and by the second surface treatment S120. Thus, a height H3 of the portion of the plurality of spacers 150 and a height H4 of the surface-modified reference pattern 140A, which are not covered by the second mask layer 220 (that is, which are exposed by the third and fourth openings 220H1 and 220H2) may be less than heights of portions of the plurality of spacers 150 and the reference patterns 140 which are covered by the second mask layer 220. In examples of the inventive concept, the portion of the plurality of spacers 150 which is not covered by the second mask layer 220 may have a third height H3 along the third direction (Z direction) from the upper surface of the hard mask layer 130, and the surface-modified reference pattern 140A may have a fourth height H4 along the third direction. Although the fourth height H4 may be equal to or similar to the third height H3, the inventive concept is not limited thereto.

Next, the second mask layer 220 may be removed.

Referring to FIGS. 1 and 8A to 9B, in an operation S60, the plurality of filling patterns 160 (see FIGS. 7A and 7B) and the plurality of reference patterns 140 may be removed such that the surface-modified filling pattern 160A and the surface-modified reference pattern 140A are not removed.

In examples of the inventive concept, the plurality of filling patterns 160 may be removed first according to a method described with reference to FIGS. 8A and 8B, and then, the plurality of reference patterns 140 may be removed according to a method described with reference to FIGS. 9A and 9B. In other examples of the inventive concept, the plurality of reference patterns 140 may be removed first according to the method described with reference to FIGS. 9A and 9B, and then, the plurality of filling patterns 160 may be removed according to the method described with reference to FIGS. 8A and 8B.

In a process for removing the plurality of filling patterns 160, the plurality of filling patterns 160 may be removed by an anisotropic etching process such as an ion beam etching process, a reactive ion etching process, a plasma etching process, a high density plasma etching process, or the like. For example, although the etching process may be a directional plasma process using nitrogen and hydrogen, the inventive concept is not limited thereto.

In a process for removing the plurality of filling patterns 160, the surface-modified filling pattern 160A may remain without being removed. For example, the surface-modified filling pattern 160A may include the lower filling pattern 160L and the upper filling pattern 160U, the upper filling pattern 160U may be densified by the first surface treatment S110 (see FIG. 6B), and the lower filling pattern 160L may not be densified by the first surface treatment S110. Thus, the plurality of filling patterns 160 and the lower filling pattern 160L may include substantially the same material, for example, a non-surface-modified SOH material, or a non-surface-modified ACL material. However, in the anisotropic etching process, the upper filling pattern 160U that is densified may not be etched, and the lower filling pattern 160L, which is located under the upper filling pattern 160U and between the plurality of spacers 150, may also be hardly removed by an etching process having high anisotropy, such as a directional plasma process.

In a process for removing the plurality of filling patterns 160, the plurality of reference patterns 140, the surface-modified reference pattern 140A, and the plurality of spacers 150, which are exposed, may also not be removed.

In examples of the inventive concept, the plurality of filling patterns 160 is removed, and an upper surface 130T1 of the mask layer 130 may be exposed again. After the plurality of filling patterns 160 is removed, a first trenches 150H1 may be formed in spaces defined by neighboring ones of the spacers 150 and the upper surface 130T1 of the exposed hard mask layer 130. The plurality of first trenches 150H1 may extend along the second direction (Y direction), and have a line shape.

Figure 8A:
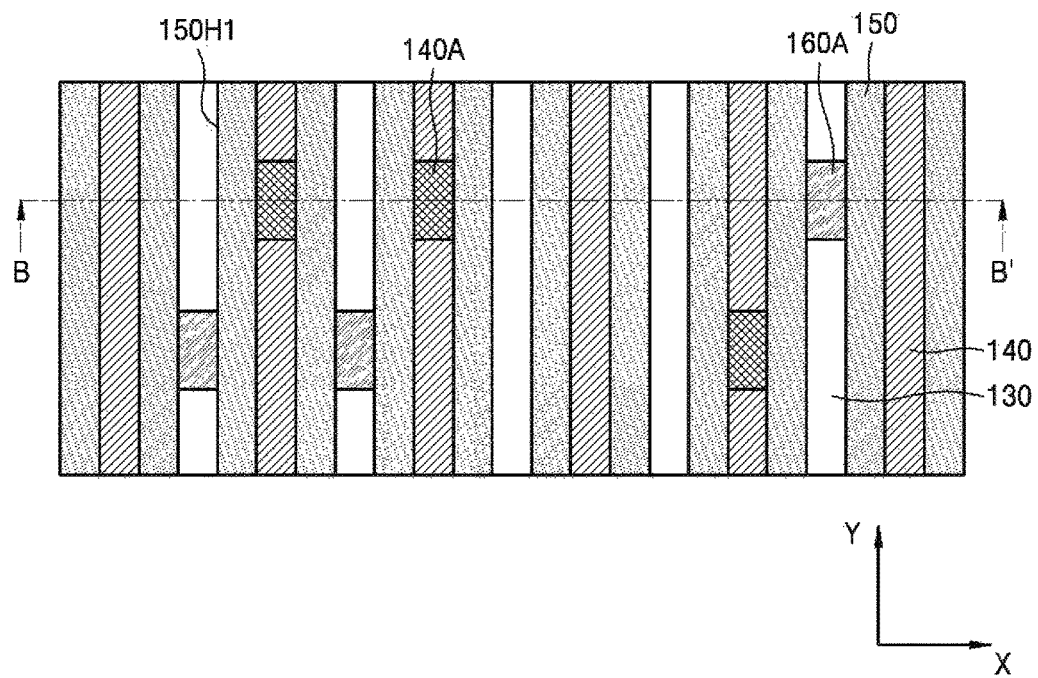
Figure 8B:
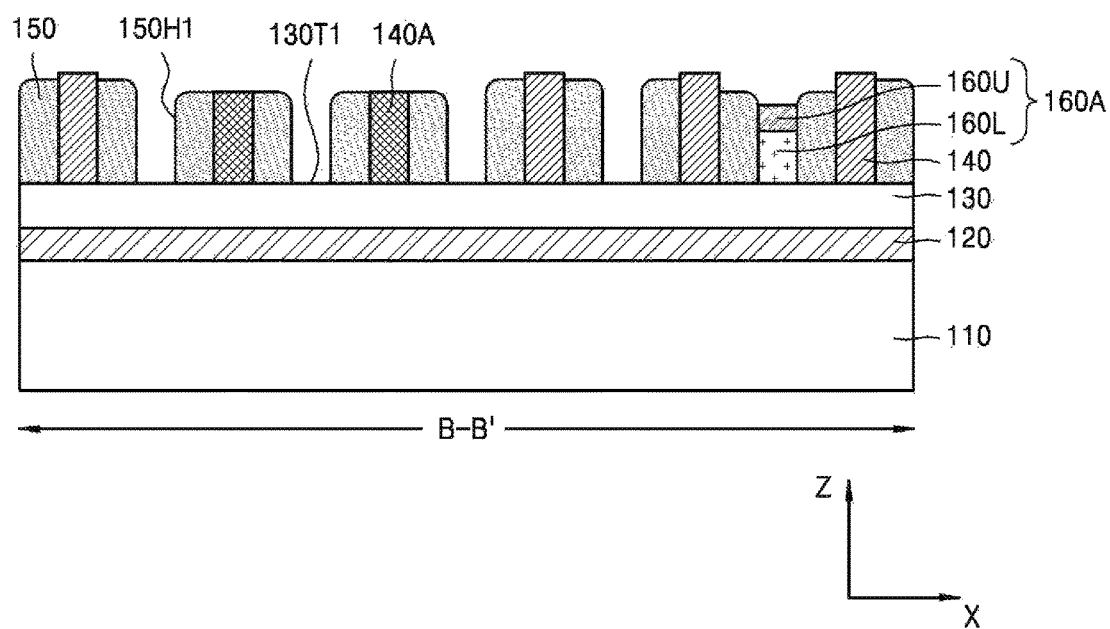

As shown in FIG. 8A, (each of) the first trenches 150H1 may have a certain width (for example, a width that is substantially equal to the third width W3 of the plurality of filling patterns 160), and extend along the second direction (Y direction). The surface-modified filling pattern 160A may be arranged between two first trenches 150H1 which are spaced apart along the second direction. That is, each of first trenches 150H1 may have a rectangular shape having two long sides and two short sides, the two long sides may be defined by side surfaces extending in the second direction of two neighboring spacers 150, and the two short sides may be defined by end surfaces of two surface-modified filling patterns 160A arranged along the second direction.

In a process for removing the plurality of reference patterns 140, the plurality of reference patterns 140 may be removed by an anisotropic etching process such as an ion beam etching process, a reactive ion etching process, a plasma etching process, a high density plasma etching process, or the like. For example, although the etching process may be a directional plasma process using sulfur hexafluoride ($SF_6$), the inventive concept is not limited thereto. In other examples of the inventive concept, the plurality of reference patterns 140 may be removed by a wet etching process using an etching solution which includes at least one of ammonium hydroxide ($NH_4OH$), nitric acid ($HNO_3$), and potassium hydroxide (KOH).

In a process for removing the plurality of reference patterns 140, the surface-modified reference pattern 140A may remain without being removed. For example, the plurality of reference patterns 140 may include amorphous silicon, and the surface-modified reference pattern 140A may include silicon nitride or silicon oxynitride by formed by the second surface treatment S120 (see FIG. 7B). Thus, the surface-modified reference pattern 140A may have an etch selectivity with respect to the plurality of reference patterns 140, and may not be removed in the process for removing the plurality of reference patterns 140.

In a process for removing the plurality of reference patterns 140, the hard mask layer 130, the plurality of spacers 150, and the surface-modified filling pattern 160A, which are exposed, may also not be removed.

In examples of the inventive concept, the plurality of reference patterns 140 are removed, and an upper surface 130T2 of the hard mask layer 130 may be exposed again. As a result, second trenches 150H2 may be formed in spaces defined by neighboring spacers 150 and the upper surface 130T2 of the exposed hard mask layer 130. Each of the second trenches 150H2 may extend along the second direction (Y direction), and have a line shape.

Figure 9A:
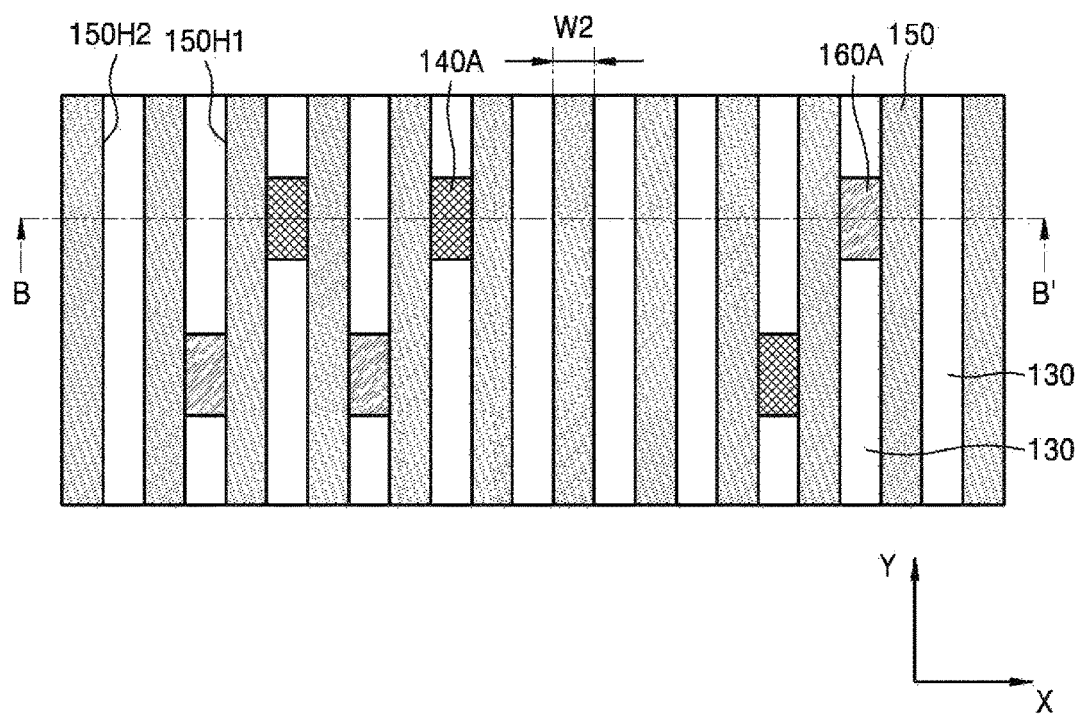

As shown in FIG. 9A, (each of) the second trenches 150H2 may have a certain width (for example, a width that is substantially equal to the first width W1 of the plurality of reference patterns 140), and extend along the second direction (Y direction). The surface-modified reference pattern 140A may be arranged between two second trenches 150H2 which are spaced apart along the second direction. That is, each of the second trenches 150H2 may have a rectangular shape having two long sides and two short sides, the two long sides may be defined by side surfaces extending in the second direction of two neighboring spacers 150, and the two short sides may be defined by end surfaces of two surface-modified reference patterns 140A arranged along the second direction.

Figure 9B:
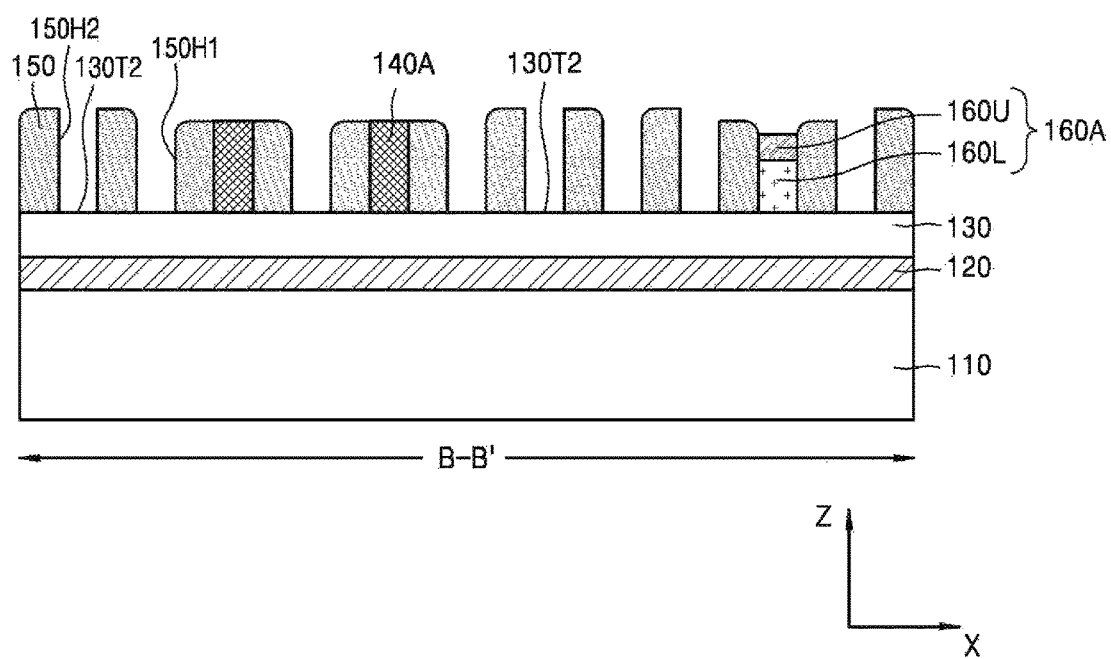

As shown in FIGS. 9A and 9B, after the plurality of reference patterns 140 and the plurality of filling patterns 160 are removed, a structure, in which the spacers 150 are spaced apart at certain intervals along the first direction (X direction), may be formed. The spacers 150 may have the second width W2 in the first direction (X direction), and when the minimum feature size of the semiconductor device is 1F, the second width W2 may be 1F. The first trench 150H1 and the second trench 150H2 may be alternately arranged along the first direction (X direction) between the spacers 150.

Referring to FIGS. 1 and 10A to 11B, in an operation S70, the feature layer may be patterned using the plurality of spacers 150, the surface-modified filling pattern 160A, and the surface-modified reference pattern 140A as an etch mask.

Figure 10A:
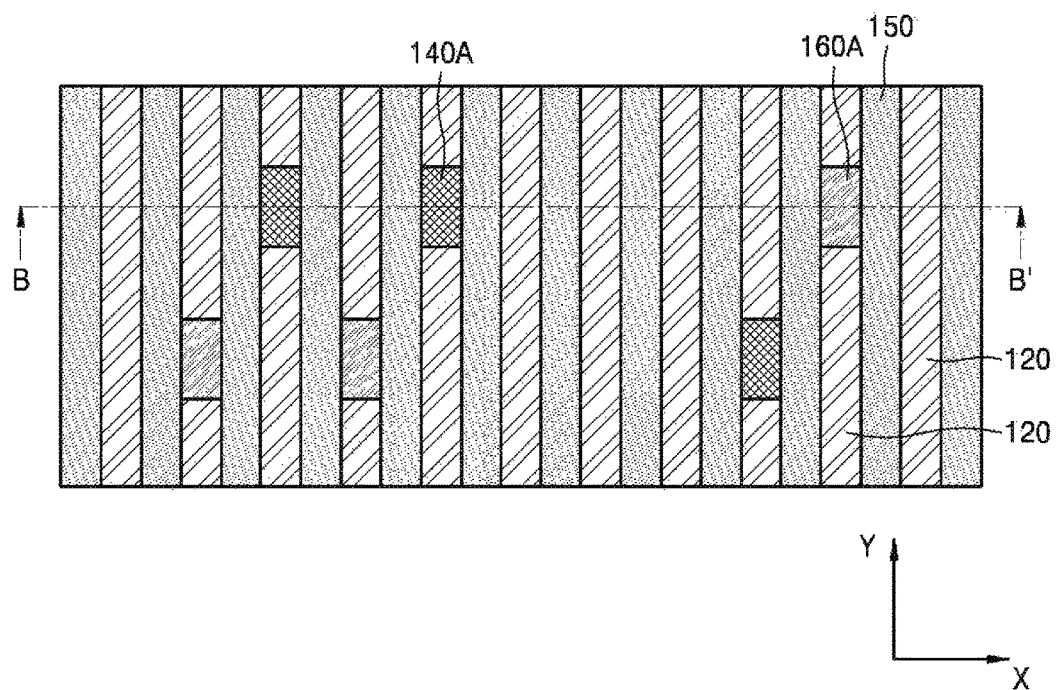
Figure 10B:
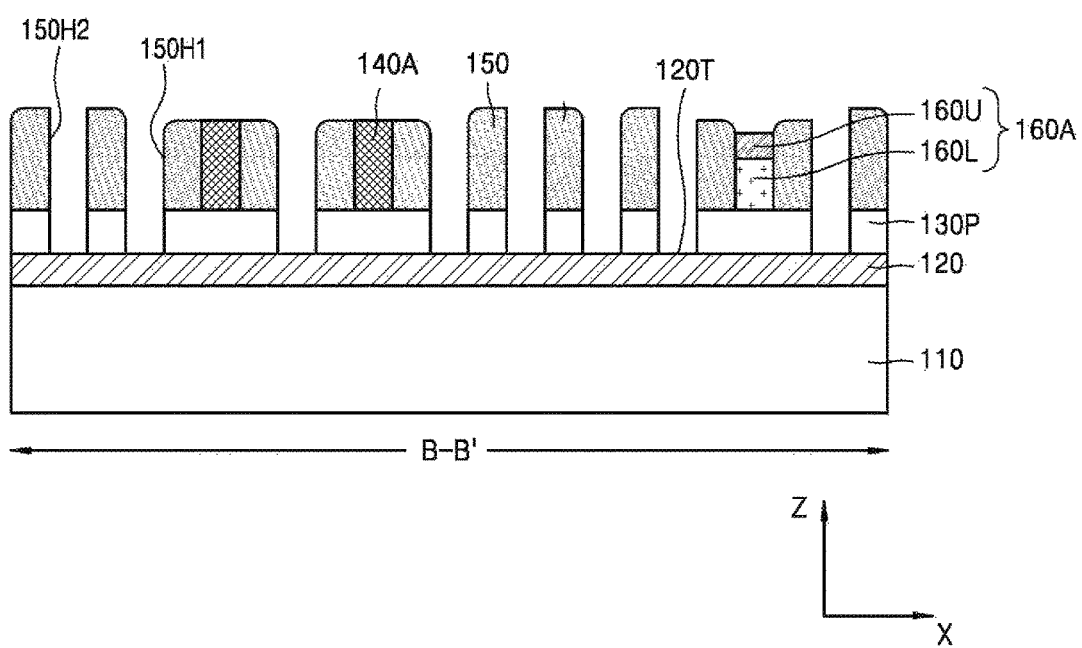

In a process for patterning the feature layer, as shown in FIGS. 10A and 10B, a hard mask pattern 130P may be formed by patterning the hard mask layer 130 using the plurality of spacers 150 as an etch mask. In a process for forming the hard mask pattern 130P, the surface-modified filling pattern 160A and the surface-modified reference pattern 140A may also remain without being removed, and may act as an etch mask for forming the hard mask pattern 130P. In addition, in a process for forming the hard mask pattern 130P, an upper surface 120T of the target layer 120, which is not covered by the spacer 150, the surface-modified filling pattern 160A, and the surface-modified reference pattern 140A, may be exposed.

As shown in FIG. 10B, in a bottom portion of the first trench 150H1, side surfaces of the hard mask pattern 130P and the upper surface 120T of the target layer 120 may be exposed, and thus, the first trench 150H1 may be extended downwards. In addition, in a bottom portion of the second trench 150H2, the side surfaces of the hard mask pattern 130P and the upper surface 120T of the target layer 120 may be exposed, and thus, the second trench 150H2 may be extended downwards.

Figure 11A:
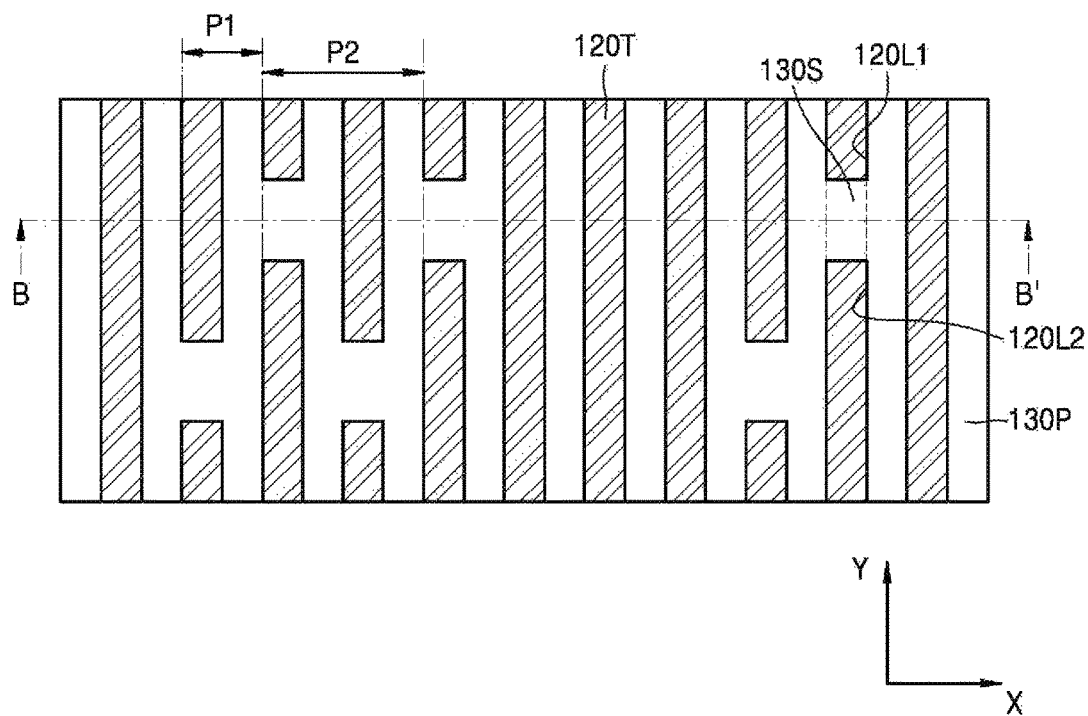
Figure 11B:
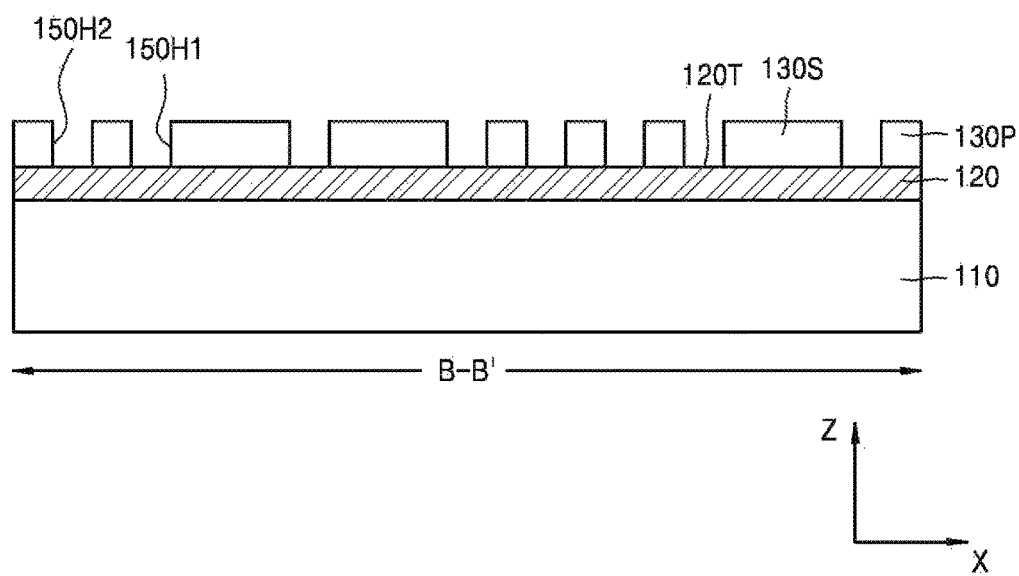

As shown in FIGS. 11A and 11B, the plurality of spacers 150, the surface-modified filling patterns 160A, and the surface-modified reference patterns 140A may be removed.

In examples of the inventive concept, a wet etching process for removing the plurality of spacers 150 and the surface-modified reference pattern 140A may be performed first, and then, an ashing process for removing the surface-modified filling pattern 160A may be performed. The wet etching process may be an etching process using an etching solution which includes phosphoric acid ($H_3PO_4$), hydrofluoric acid (HF), or the like. The ashing process may be a plasma ashing process including oxygen ($O_2$) and/or carbon tetrafluoride ($CF_4$). However, the inventive concept is not limited thereto.

In other examples of the inventive concept, an ashing process for removing the surface-modified filling pattern 160A may be performed first, and then, a wet etching process for removing the plurality of spacers 150 and the surface-modified reference pattern 140A may be performed.

As shown in FIGS. 11A and 11B, as a result of the removing of the plurality of spacers 150, the surface-modified filling patterns 160A, and the surface-modified reference patterns 140A, first and second line pattern spaces 120L1 and 120L2 may be formed.

In examples of the inventive concept, because portions of the hard mask pattern 130P are covered by the surface-modified filling patterns 160A and the surface-modified reference patterns 140A, line separation patterns 130S may be formed.

Figure 12A:
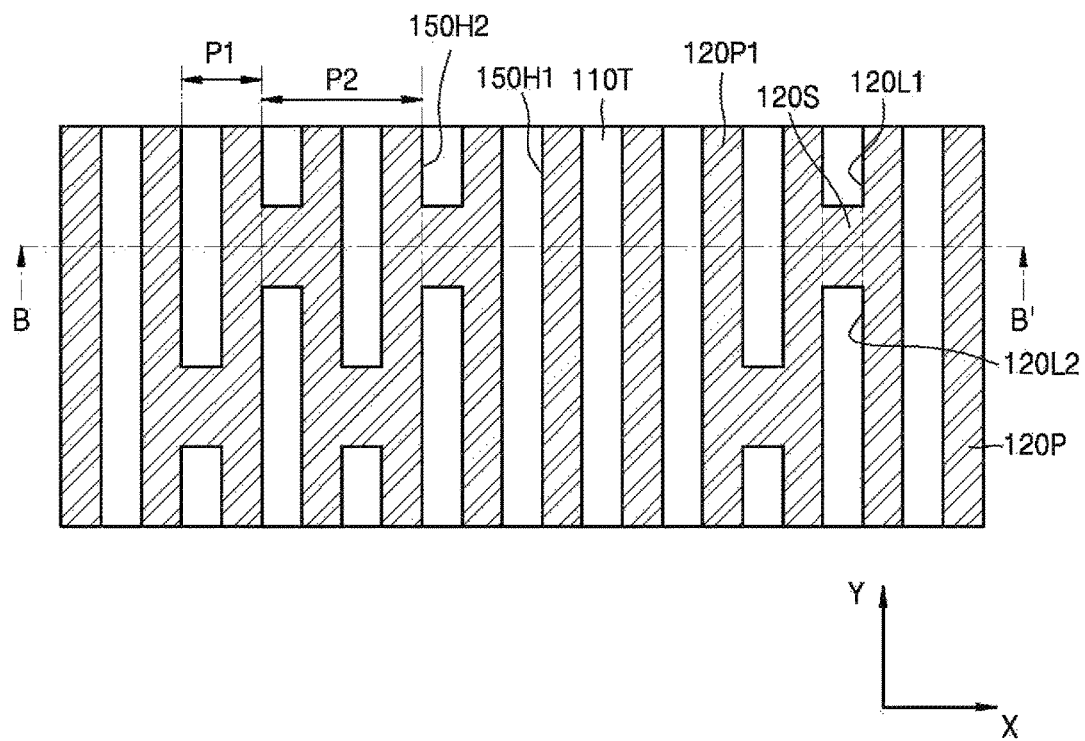
Figure 12B:
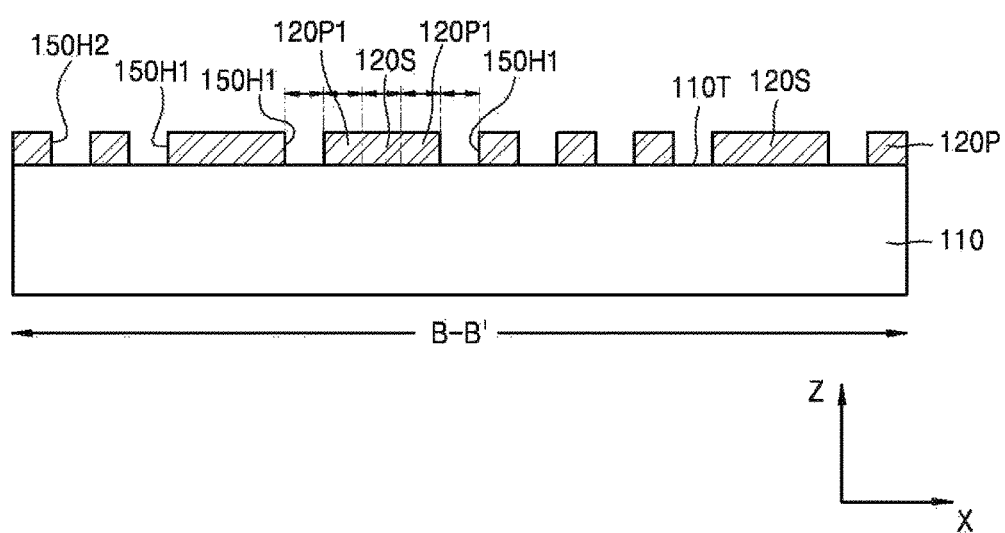

Referring to FIGS. 12A and 12B, a target layer pattern 120P may be formed by etching the target layer 120 using the hard mask pattern 130P as an etch mask. In a process of forming the target layer pattern 120P, the target layer 120 which is not covered by the hard mask pattern 130P may be removed, and an upper surface 110T of the substrate 110 may be exposed.

In addition, in a process of forming the target layer pattern 120P, the residual portions of the first trench 150H1 and the second trench 150H2 may be extended downwards, and may be defined by the exposed upper surface 110T of the substrate 110 and side surfaces of the target layer pattern 120P. A portion of the target layer pattern 120P, which is covered by the line separation pattern 130S of the hard mask pattern 130P, may be referred to as a line separation pattern 120S.

Next, the hard mask pattern 130P may be removed.

The target layer pattern 120P including the first and second line pattern spaces 120L1, 120L2 may be formed by performing the processes described above.

The first line pattern space 120L1 and the second line pattern space 120L2 may be spaced apart from each other along the second direction (Y direction) on the substrate 110. Specifically, in the region that was the first trench 150H1, a first line pattern space 120L1 and a second line pattern space 120L2 may be spaced apart from each other by a line separation pattern 120S. In addition, in the region that was the second trench 150H2, a first line pattern space 120L1 and a second line pattern space 120L2 may be spaced apart from each other by a line separation pattern 120S.

As shown in FIGS. 12A and 12B, the target layer pattern 120P may include a plurality of target patterns 120P1 extending in the second direction, and each of the plurality of target patterns 120P1 may have a line shape.

Each line separation pattern 120S may be arranged between two neighboring target patterns 120P1. In addition, each line separation pattern 120S may be formed integrally with two neighboring target patterns 120P1.

As shown in FIG. 12B, one line separation pattern 120S may be arranged between two second trenches 150H2 neighboring each other along the first direction (X direction), with a respective target pattern 120P1 interposed between the line separation pattern 120S and each of the two second trenches 150H2, or one line separation pattern 120S may be arranged between two first trenches 150H1 neighboring each other along the first direction with a respective target pattern 120P1 interposed between the line separation pattern 120S and each of the two first trenches 150H1. Thus, on the substrate 110, a first trench 150H1, target pattern 120P1, the line separation pattern 120S, target pattern 120P1, and first trench 150H1 may be arranged side by side along the first direction.

In examples of the inventive concept, the line separation pattern 120S may have a relatively small width along the first direction (X direction). When the minimum feature size of the semiconductor device is 1F, the width of the line separation pattern 120S along the first direction may be 1F. However, the inventive concept is not limited thereto.

Generally, line patterns or line pattern spaces formed by a DPT process may have a width of 1F which is the minimum feature size of the semiconductor device. However, a minimum line width which can be achieved by a photolithography process (or a resolution limit width of photolithography) may be, for example, greater than 2F. Thus, when a blocking mask is formed using a photolithography process in order to form a separation region for line patterns or a separation region for line pattern spaces by a DPT process, a minimum width of the blocking mask will typically need to be greater than 2F (for example, the minimum width may be 4F) and accordingly, it may be extremely difficult to form a separation region for separating only one line pattern. Therefore, generally, a separation region for simultaneously separating each of two neighboring line patterns is formed.

Moreover, as the line patterns have become denser, i.e., as the pitch of the line patterns becomes smaller, a process margin of the blocking mask may not be secured resulting in a misalignment of the blocking mask. Due to misalignment of the blocking mask, precision in formation of a separation region of the line patterns may be further reduced. For example, undesired neighboring line patterns may be covered by the blocking mask, or line patterns which need to be separated may not be completely covered by the blocking mask. If the line patterns are metal wiring line patterns, reliability of the semiconductor device including the wiring line patterns may be deteriorated. For example, a short circuit may occur between end portions of neighboring wiring line patterns, or an oxide bridge may occur in an insulating interlayer surrounding the wiring line patterns.

However, according to a method of fabricating a semiconductor device described with reference to FIGS. 1 to 12B, the surface-modified filling pattern 160A and the surface-modified reference pattern 140A may be formed by the first surface treatment S110 and the second surface treatment S120, and the target layer pattern 120P may be formed using the plurality of spacers 150, the surface-modified filling pattern 160A, and the surface-modified reference pattern 140A as an etch mask. Each of the surface-modified filling pattern 160A and the surface-modified reference pattern 140A may function as an etch mask for forming the line separation pattern 120S having a width of 1F. Thus, the line separation pattern 120S selectively separating only one line pattern (or one line pattern space into spaces 120L1, 120L2) may be formed. Therefore, according to the fabrication method, flexibility in designing line patterns in a DPT process can be improved.

In addition, according to the fabrication method, because the line separation pattern 120S may be formed by performing the first and second surface treatments S110 and S120, an additional photolithography process in which a blocking mask is used for a separation region of line patterns can be omitted. Therefore, the target layer pattern 120P having the line separation pattern 120S may be formed by a relatively simple process.

Figure 13:
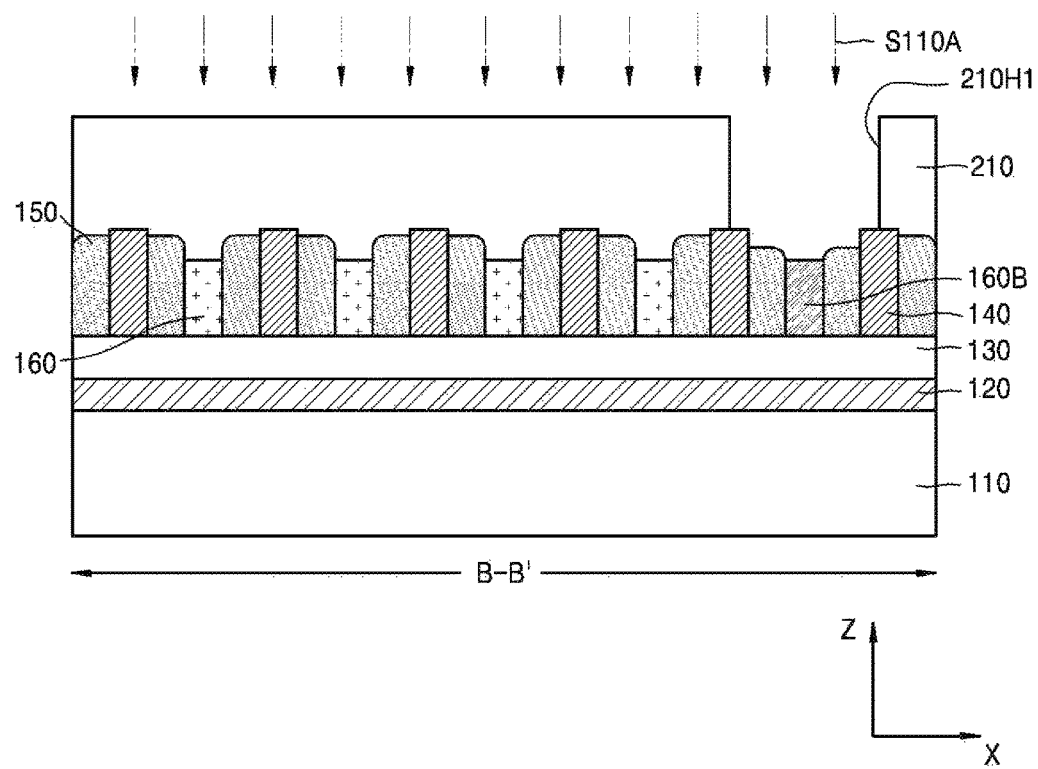
FIG. 13 is a cross-sectional view for illustrating a method of fabricating a semiconductor device according to examples of the inventive concept.

FIG. 13 is a cross-sectional view for use in explaining another example of a method of fabricating a semiconductor device according to the inventive concept.

First, the processes described with reference to FIGS. 1 to 5B are performed, thereby forming a structure in which the first mask layer 210 including the first opening 210H1 is arranged on the mold pattern 170.

Referring to FIG. 13, a first surface treatment S110A may be performed, whereby a surface-modified filling pattern 160B may be formed from the filling pattern 160 exposed by the first opening 210H1. The surface-modified filling pattern 160B may include an insulating material which is densified throughout the total height (thickness) thereof. In a process for forming the surface-modified filling pattern 160B, an ion implantation process for implanting silicon ions, germanium ions, and/or metal impurity ions into an upper side of the filling pattern 160 which includes an SOH material or an ACL material may be performed, thereby densifying the overall filling pattern 160. In other examples of the inventive concept, the first surface treatment S110A may be a plasma process using at least one of argon (Ar), nitrogen ($N_2$), helium (He), krypton (Kr), and xenon (Xe).

Next, the processes described with reference to FIGS. 7A to 12B may be performed.

The surface-modified filling pattern 160B may include an SOH material or an ACL material which is densified throughout the total height thereof, or may include an SOH material or an ACL material including silicon, germanium, or metal impurity ions. Thus, the surface-modified filling pattern 160B may not be damaged in wet or dry etching processes which may be subsequently performed. Therefore, precision in a patterning process of the hard mask pattern 130P or the target layer pattern 120P, which is subsequently performed, can be improved.

Figure 14:
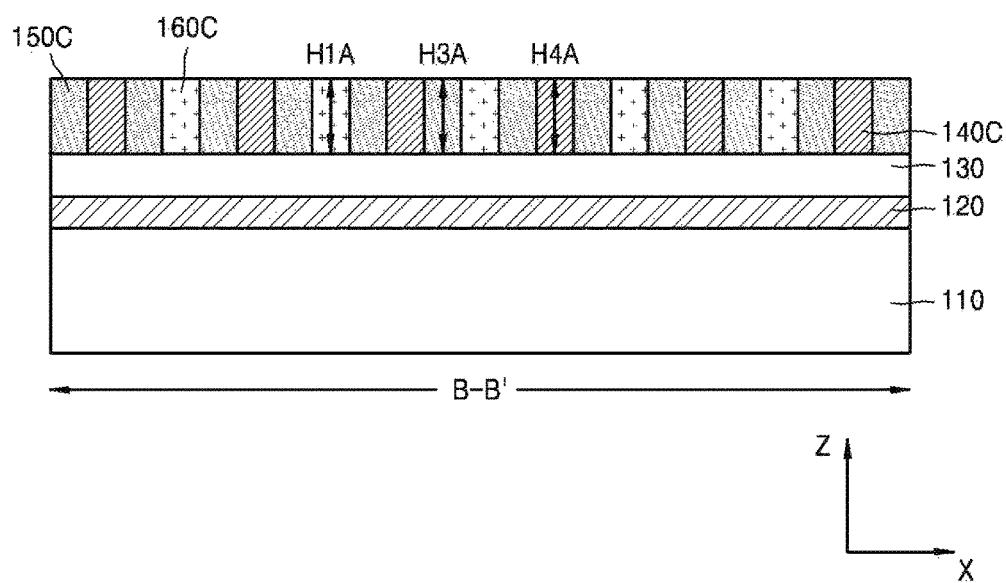
FIG. 14 is a cross-sectional view for illustrating a method of fabricating a semiconductor device according to examples of the inventive concept.

FIG. 14 is a cross-sectional view for use in explaining other examples of a method of fabricating a semiconductor device according to the inventive concept.

First, the processes described with reference to FIGS. 1 to 3B are performed, thereby forming a structure in which a plurality of reference patterns 140C and a plurality of spacers 150C on both side surfaces of each of the plurality of reference patterns 140C are arranged on the hard mask layer 130.

Referring to FIG. 14, a plurality of filling patterns 160C may be formed between the plurality of spacers 150C and on the upper surface 130T (see FIG. 3B) of the hard mask layer 130.

To form the plurality of filling patterns 160C, as shown in FIG. 3B, a filling layer (not shown), which covers exposed surfaces of a plurality of reference patterns 140C and exposed surfaces of the hard mask layer 130, is formed to a uniform thickness, followed by planarizing the filling layer such that an upper surface of each of the plurality of reference patterns 140C is exposed, thereby leaving the plurality of reference patterns 140C as a residual portion of the filling layer. For example, the planarization process may be a chemical mechanical polishing (CMP) process. After the planarization process, the spacers 150C, the filling patterns 160C, and the reference patterns 140C may have upper surfaces that are at the same level, i.e., which are coplanar.

Next, the processes described with reference to FIGS. 5A to 12B may be performed.

Since the spacers 150C, the filling patterns 160C, and the reference patterns 140C have the upper surfaces that are at the same level, precision of patterning in a subsequent patterning process for forming the first and second mask layers 210 and 220 can be improved. However, the inventive concept is not limited thereto.

FIGS. 15 to 18 are cross-sectional views for use in explaining still other examples of a method of fabricating a semiconductor device according to the inventive concept. The fabrication method may be a method of fabricating a semiconductor device using a quadruple patterning technology (QPT).

Figure 15:
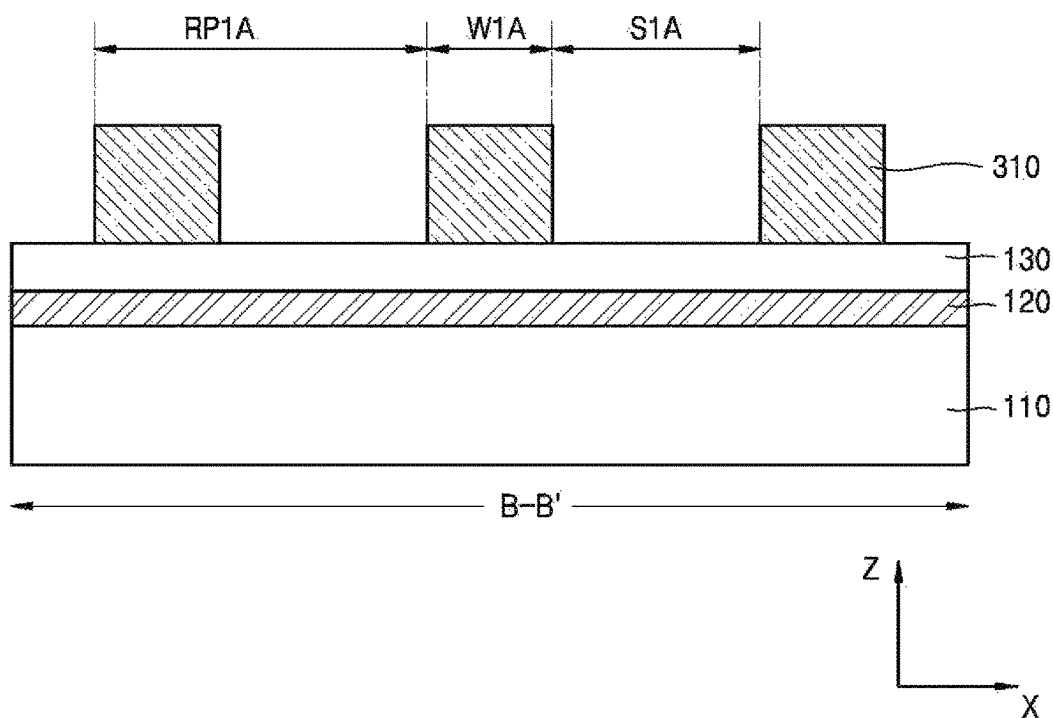
FIGS. 15 to 18 are cross-sectional views for illustrating a method of fabricating a semiconductor device according to examples of the inventive concept.

Referring to FIG. 15, first material layer patterns 310, which are repeated according to a constant reference pitch RP1A along the first direction (X direction), may be formed on the hard mask layer 130 on the target layer 120.

The plurality of first material layer patterns 310 may include a material having an etch selectivity with respect to a second material layer 320P which is formed by a method described with reference to FIG. 16. For example, the plurality of first material layer patterns 310 may include silicon nitride or silicon oxide, without being limited thereto.

In examples of the inventive concept, when the minimum feature size of the semiconductor device is 1F, the reference pitch RP1A may be 8F. A first width W1A of the plurality of first material layer patterns 310 and a first spacing S1A between neighboring first material layer patterns 310 may be different and selected according to the kind and required properties of the semiconductor device, a material of the hard mask layer 130, a material of the target layer 120, etc. For example, the first width W1A of the plurality of first material layer patterns 310 may be 3F, and the first spacing S1A may be 5F. However, the inventive concept is not limited thereto.

Figure 16:
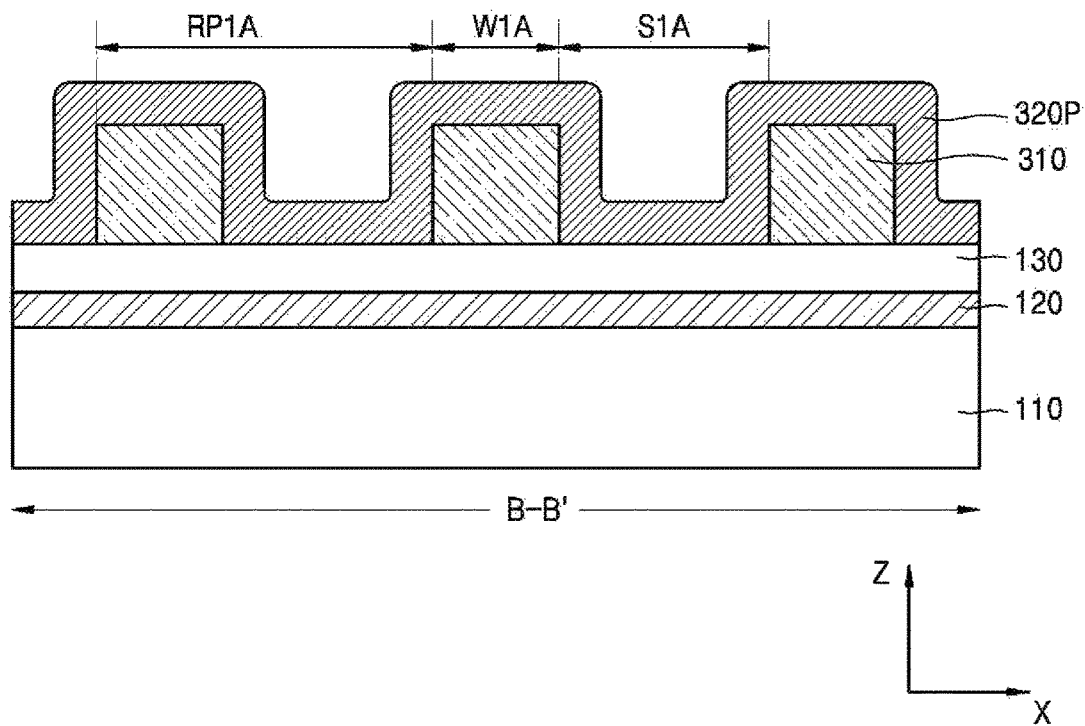
Figure 17:
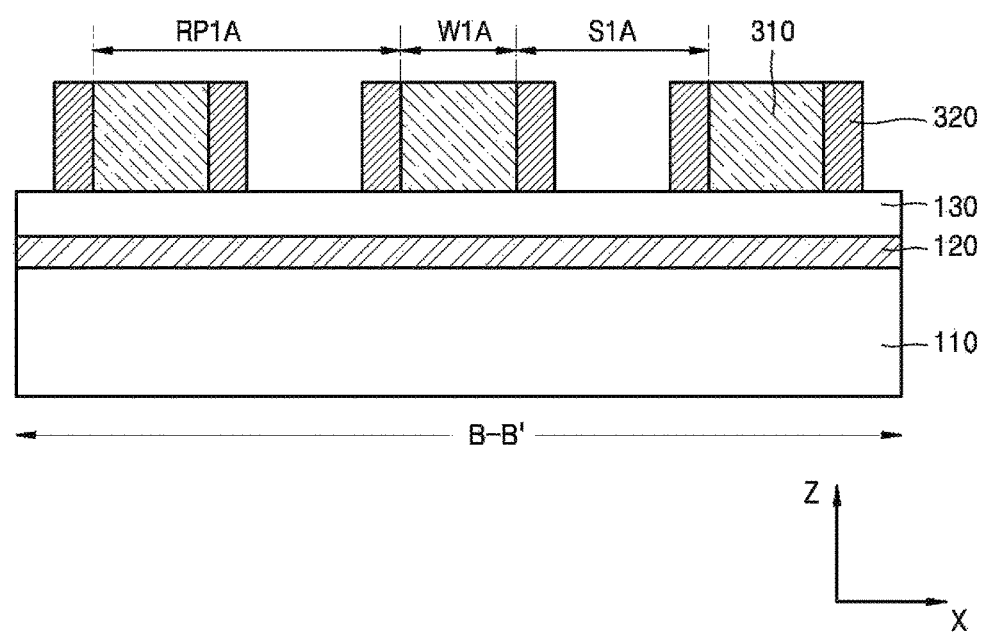

Referring to FIGS. 16 and 17, a plurality of second material layer patterns 320 covering both side surfaces of each of the plurality of first material layer patterns 310 may be formed.

In a process for forming the second material layer patterns 320, a second material layer 320P, which covers exposed surfaces of the plurality of first material layer patterns 310 and exposed surfaces of the hard mask layer 130, may be formed to a uniform thickness. Next, as shown in FIG. 17, the second material layer 320P is subjected to an etch back process such that an upper surface of each of the plurality of first material layer patterns 310 and a portion of an upper surface of the hard mask layer 130 are exposed, thereby leaving the plurality of second material layer patterns 320 as a residual portion of the second material layer 320P.

The plurality of second material layer patterns 320 may include a material having a sufficient etch selectivity with respect to the hard mask layer 130 and the plurality of first material layer patterns 310 and also having a sufficient etch selectivity with respect to the plurality of spacers 150 and the plurality of filling patterns 160, which will be formed by the method described with reference to FIGS. 3A to 4B in a subsequent process. In some examples of the inventive concept, the plurality of second material layer patterns 320 may include amorphous silicon or polysilicon. However, the inventive concept is not limited thereto.

Figure 18:
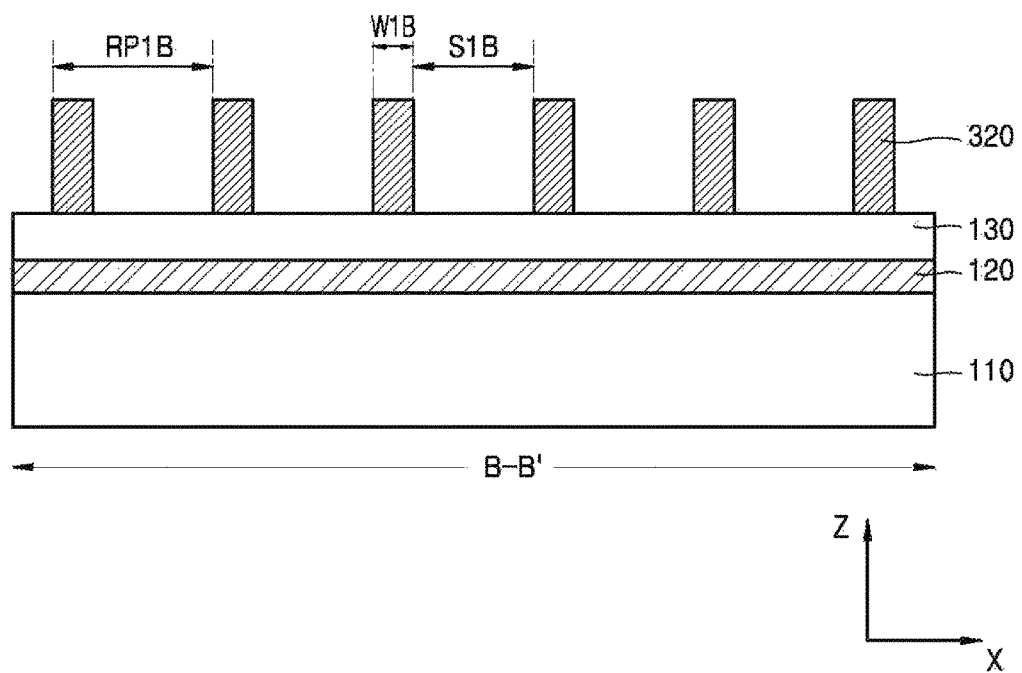

Referring to FIG. 18, the plurality of first material layer patterns 310 (see FIG. 17) may be removed, and a surface of the hard mask layer 130 that has been covered by the plurality of first material layer patterns 310 may be exposed.

In a process for removing the plurality of first material layer patterns 310, the second material layer patterns 320 may be left as repeated on the hard mask layer 130 according to a constant reference pitch RP1B along the first direction (X direction).

In examples of the inventive concept, when the minimum feature size of the semiconductor device is 1F, the reference pitch RP1B may be 4F. In addition, a first width W1B of the plurality of second material layer patterns 320 may be 1F, and a first spacing S1B between neighboring second material layer patterns 320 may be 3F.

Next, the processes described with reference to FIGS. 1 to 12B may be performed.

The plurality of second material layer patterns 320 may be replaced by the plurality of reference patterns 140 described with reference to FIGS. 1 to 12B.

Figure 19:
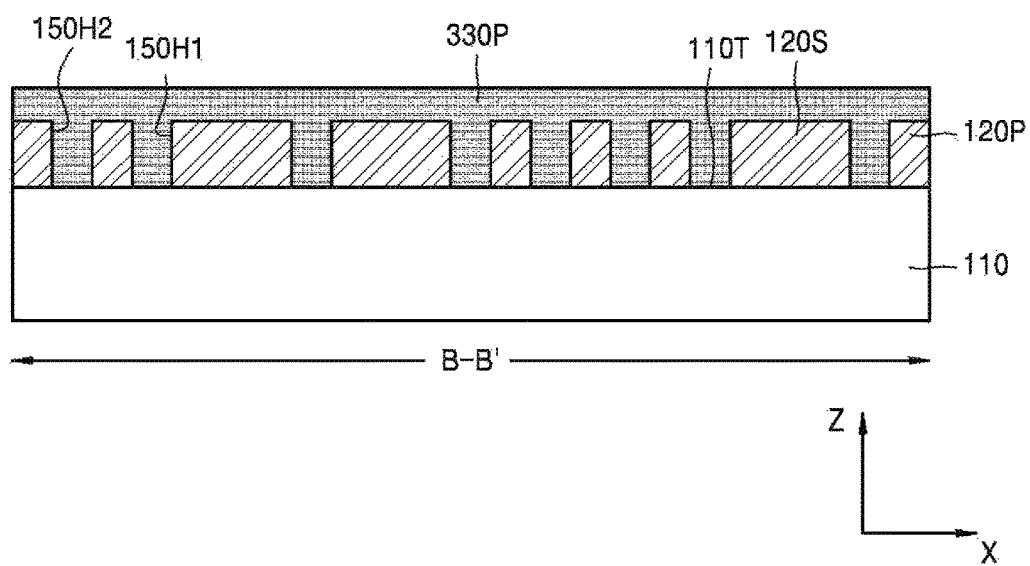
FIGS. 19 to 20B are plan views and cross-sectional views for explaining a method of fabricating a semiconductor device according to examples of the inventive concept.
Figure 20A:
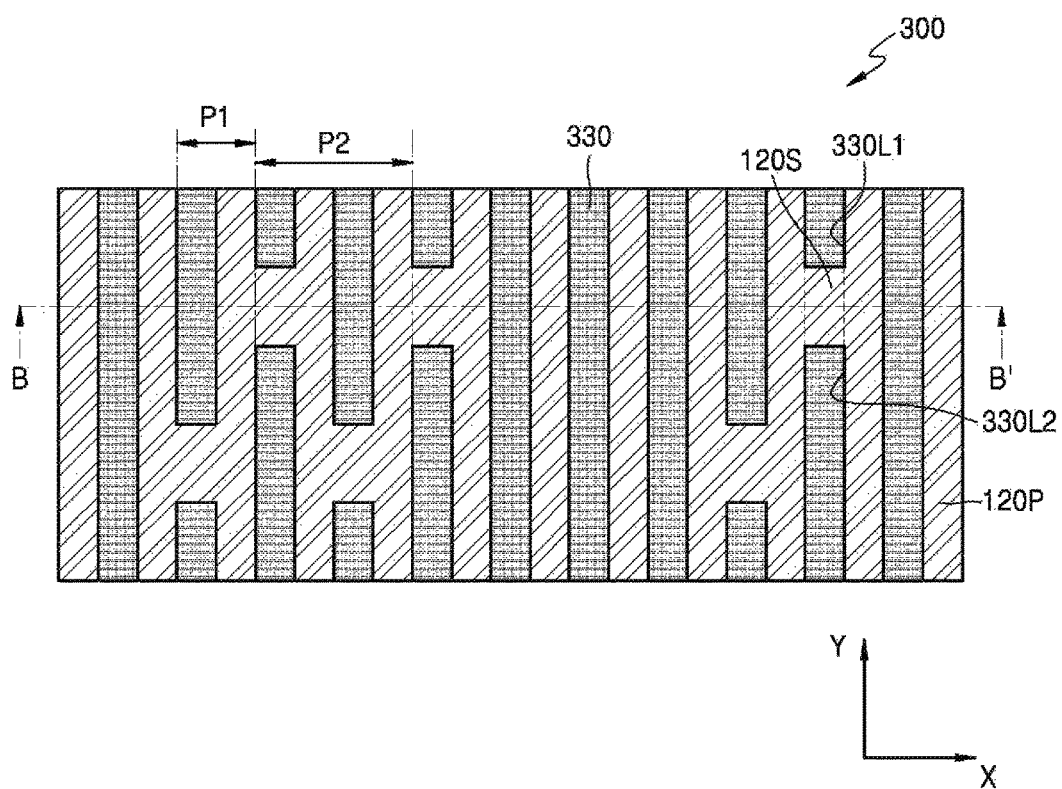
Figure 20B:
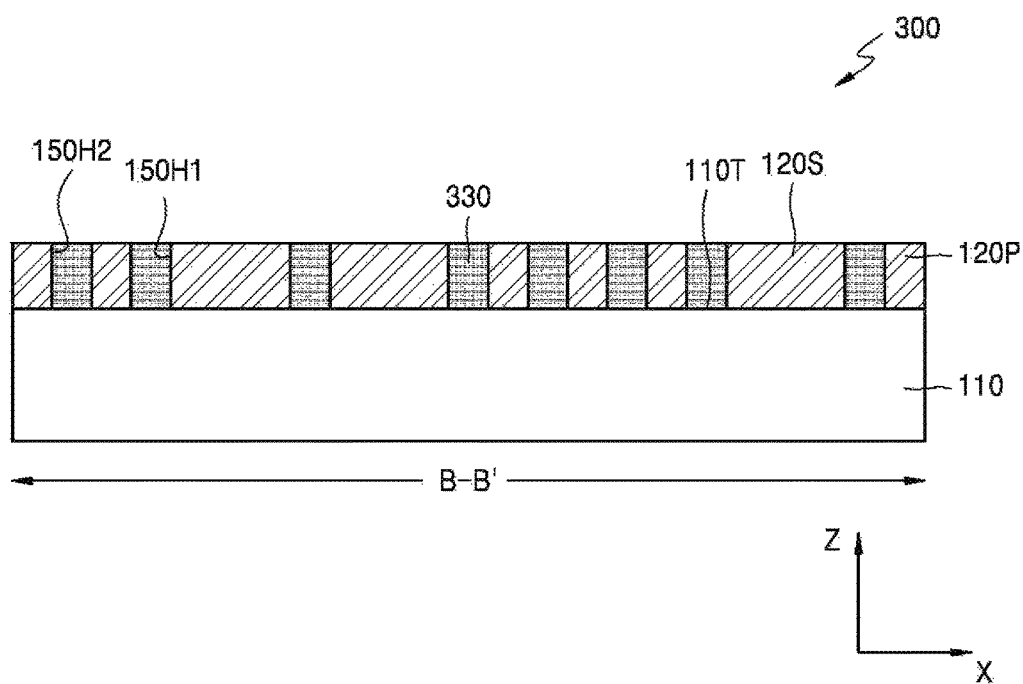

FIGS. 19 to 20B are plan views and cross-sectional views for use in explaining examples of a method of fabricating a semiconductor device according to the inventive concept. The fabrication method may be a method of fabricating a semiconductor device 300 including a wiring pattern formed using the target layer pattern 120P described with reference to FIGS. 1 to 12B.

First, the processes described with reference to FIGS. 1 to 12B are performed, thereby forming a structure in which the target layer pattern 120P is formed on the substrate 110.

Referring to FIG. 19, a wiring material layer 330P may be formed on the substrate 110 and the target layer pattern 120P.

In examples of the inventive concept, the substrate 110 may include a semiconductor element such as silicon (Si) or germanium (Ge), or a compound semiconductor such as silicon carbide (SiC), gallium arsenide (GaAs), indium arsenide (InAs), or indium phosphide (InP). The substrate 110 may include a conductive region, for example, an impurity-doped well, or an impurity-doped structure. In addition, the substrate 110 may have any of various device isolation structures such as a shallow trench isolation (STI) structure.

In examples of the inventive concept, a plurality of various individual devices (not shown) may be formed between the substrate 110 and the target layer pattern 120P. The plurality of individual devices may make up a microelectronic device and may include, for example, a metal-oxide-semiconductor field effect transistor (MOSFET), a system large scale integrated circuit (system LSI), and a CMOS imaging sensor (CIS), a micro-electro-mechanical system (MEMS), an active device, a passive device, or the like. The plurality of individual devices may be electrically connected to a conductive region of the substrate 110.

In examples of the inventive concept, the target layer pattern 120P may include at least one of flowable oxide (FOX), high density plasma (HDP) oxide, tonen silazene (TOSZ), spin on glass (SOG), and undoped silica glass (USG). The target layer pattern 120P may be an insulating interlayer including a plurality of insulating layers, and the plurality of individual devices may be electrically separated from each other by the plurality of insulating layers. However, the inventive concept is not limited thereto.

In a process for forming a wiring material layer 330P, a conductive layer (not shown), which conformally covers the target layer pattern 120P and the substrate 110, may be formed to a certain thickness, and then, the wiring material layer 330P, which fills the first trench 150H1 and the second trench 150H2 of the target layer pattern 120P, may be formed on the conductive layer by an electroplating process. For example, the conductive layer may be formed, by a PVD process or a CVD process, of Ti, TiN, Ta, TaN, Ru, Co, Mn, WN, Ni, or NiB. The wiring material layer 330P may be formed of Cu, CuSn, CuMg, CuNi, CuZn, CuPd, CuAu, CuRe, CuW, W, or W alloys, without being limited thereto.

Referring to FIGS. 20A and 20B, an upper surface of the target layer pattern 120P may be exposed by planarizing an upper side of the wiring material layer 330P (see FIG. 19) by a CMP process. Thus, a wiring pattern 330 filling the first trench 150H1 and the second trench 150H2 may be formed on the substrate 110.

In the wiring pattern 330, a first line pattern 330L1 and a second line pattern 330L2, which neighbor each other along the second direction (Y direction), may be spaced apart from each other with the line separation pattern 120S therebetween. When widths of the first line pattern 330L1 and the second line pattern 330L2 along the first direction (X direction) are 1F, the width of the line separation pattern 120S along the first direction (X direction) may also be 1F. A first pitch P1 of the line patterns 330L1, 330L2 may be 2F, and a second pitch P2 of the line separation patterns 120S may be 4F. In this example, the width of the line separation pattern 120S may be 1F, and a spacing between the line separation patterns 120S may be 3F. However, the inventive concept is not limited thereto.

In the target layer pattern 120P fabricated by the processes described with reference to FIGS. 1 to 12B, the line separation pattern 120S may have a width of 1F. In particular, without the need to generally form a separation region simultaneously separating each of two neighboring line patterns in order to separate line patterns formed using a DPT process, the line separation pattern 120S selectively separating only one line pattern may be formed. The semiconductor device 300 may include the wiring pattern 330 providing improved flexibility in design.

In the target layer pattern 120P fabricated by the processes described with reference to FIGS. 1 to 12B, a separation process using a blocking mask for forming a separation region of line patterns can be omitted. Thus, a short circuit between end portions of the line patterns 330L1, 330L2 due to misalignment of the blocking mask can be prevented, and an oxide bridge in an insulating interlayer surrounding the line patterns 330L1 and 330L2 can be prevented. Therefore, the semiconductor device 300 can have excellent reliability.

Although the method of fabricating the semiconductor device 300 including the wiring pattern 330 has been described with reference to FIGS. 19 to 20B as an example, the inventive concept is not limited thereto.

Using the target layer pattern 120P fabricated by the processes described with reference to FIGS. 1 to 18, a plurality of gate lines (not shown) extending parallel to each other may be formed on a substrate. To form the plurality of gate lines, a gate insulating layer (not shown) conformally covering the trenches 150H1 and 150H2 of the target layer pattern 120P may be formed, followed by forming a conductive layer (not shown) filling the trenches 150H1 and 150H2 on the gate insulating layer, and then, an upper portion of the conductive layer may be planarized until the upper surface of the target layer pattern 120P is exposed. Thus, the plurality of gate lines filling the trenches 150H1 and 150H2 may be formed.

Using the target layer pattern 120P fabricated by the processes described with reference to FIGS. 1 to 18, fin-type active regions (not shown) extending parallel to each other may be formed on a substrate. To form the fin-type active regions, a hard mask layer (not shown) filling the trenches 150H1 and 150H2 may be formed on the substrate and the target layer pattern 120P, followed by planarizing an upper side of the hard mask layer until the upper surface of the target layer pattern 120P is exposed, thereby forming a hard mask (not shown) filling the trenches 150H1 and 150H2. Next, the target layer pattern 120P is removed, followed by etching an exposed surface of the substrate using the hard mask as an etch mask, thereby forming a plurality of fin-type active regions.

FIGS. 21 to 28 are plan views for use in explaining other examples of a method of fabricating a semiconductor device according to the inventive concept.

First, the mold pattern 170, which includes the plurality of reference patterns 140, the plurality of spaces 150, and the plurality of filling patterns 160, may be formed on the hard mask layer 130 by performing the processes described with reference to FIGS. 1A to 4B.

Figure 21:
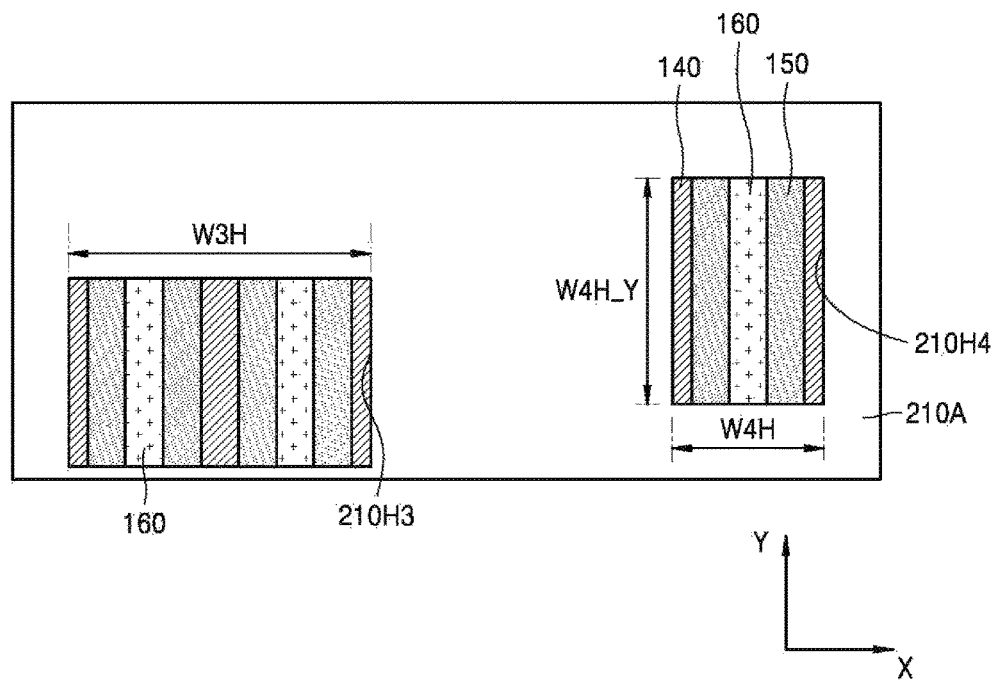
FIGS. 21 to 28 are plan views for explaining a method of fabricating a semiconductor device according to examples of the inventive concept.

Referring to FIG. 21, a first mask layer 210A including first and second openings 210H3 and 210H4 may be formed on the mold pattern 170.

The first opening 210H3 may have a first width W3H along an X direction, the second opening 210H4 may have a second width W4H along the X direction, and the first width W3H and the second width W4H may differ according to a width of a line pattern intended to be formed. A relationship between the first and second widths W3H and W4H and the width of the line pattern will be described below in detail.

Figure 22:
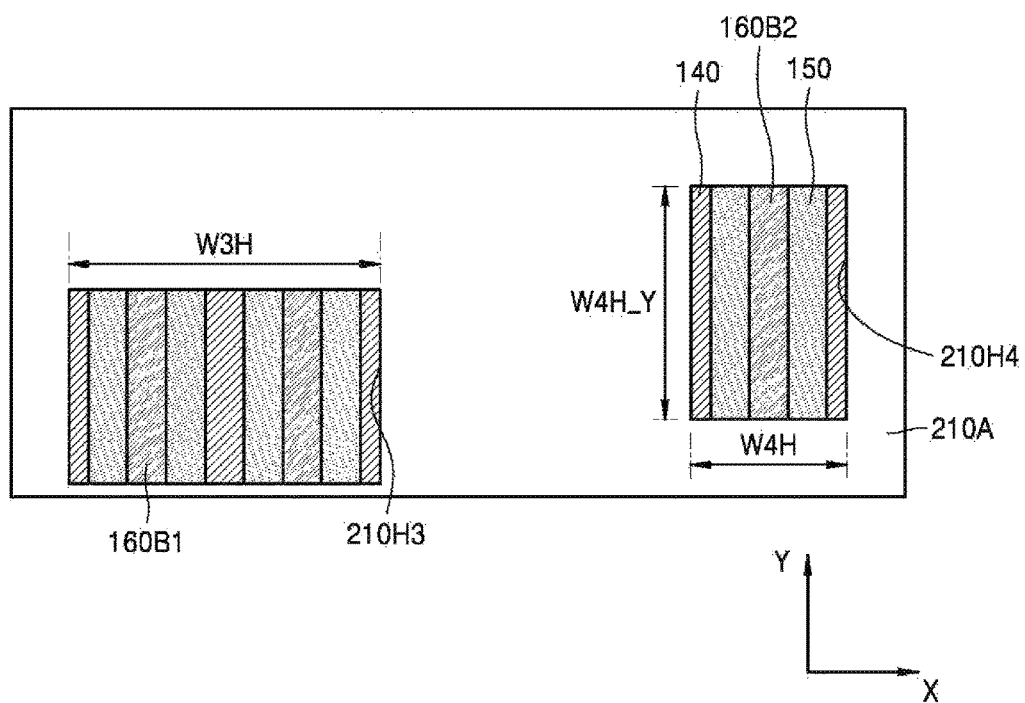

Referring to FIG. 22, first and second surface-modified filling patterns 160B1, 160B2 may be formed by performing the first surface treatment S110 (see FIGS. 6A and 6B) on a portion of the plurality of filling patterns, which is exposed by the first and second openings 210H3 and 210H4.

The first and second surface-modified filling patterns 160B1 and 160B2 may include the lower filling pattern 160L of an SOH or an ACL, and the upper filling pattern 160L which is located on the lower filling pattern 160L and includes a densified SOH material or a densified ACL material.

The first surface treatment S110 may be similar to the first surface treatment S110 described with reference to FIGS. 5A to 6B.

Next, the first mask layer 210A may be removed.

Figure 23:
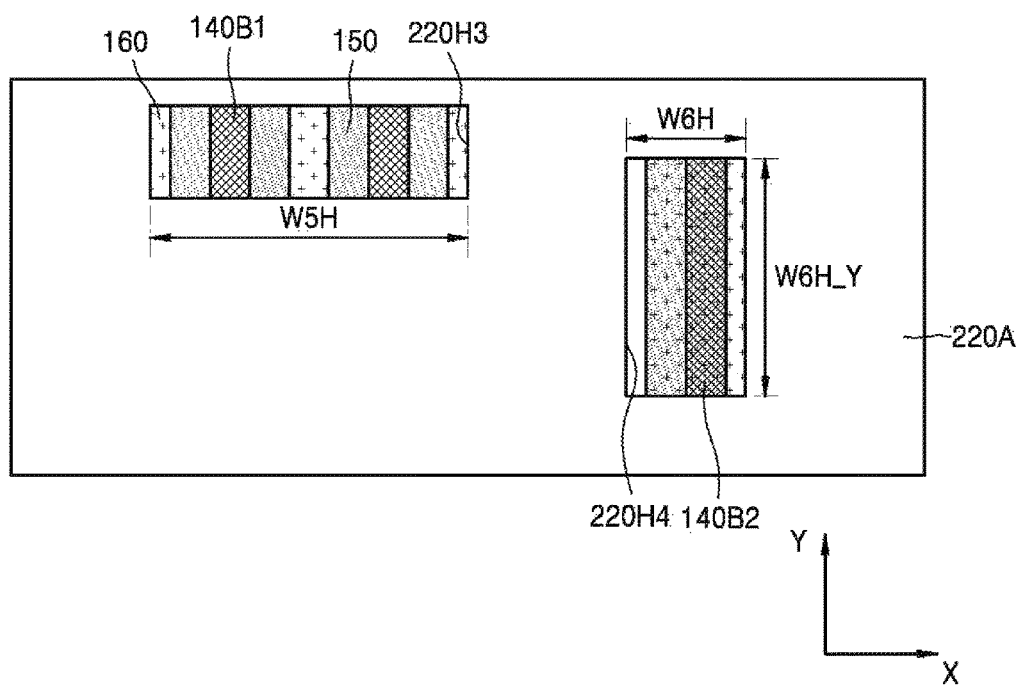

Referring to FIG. 23, a second mask layer 220A including third and fourth openings 220H3 and 220H4 may be formed on the mold pattern 170.

The third opening 220H3 may have a third width W5H along the X direction, the fourth opening 220H4 may have a fourth width W6H along the X direction, and the third width W5H and the fourth width W6H may differ according to a width of a line pattern intended to be formed. A relationship between the third and fourth widths W5H, W6H and the width of the line pattern will be described below in detail.

Next, a portion of the plurality of reference patterns 140, which is exposed by the third and fourth openings 220H3 and 220H4, may be nitrided by performing the second surface treatment S120 (see FIGS. 7A and 7B) on the mold pattern 170 exposed by the third and fourth openings 220H3 and 220H4, thereby forming first and second surface-modified reference patterns 140B 1 and 140B2.

The second surface treatment S120 may be similar to the second surface treatment S120 described with reference to FIGS. 7A to 7B.

The fourth opening 220H4 of the second mask layer 220A may be provided in correspondence with a region in which the second opening 210H2 of the first mask layer 210A was located. For example, the second opening 210H2 shown in FIG. 22 may expose portions of the spacers 150 on both sides of the second surface-modified filling pattern 160B2 together with portions of the plurality of reference patterns 140 on one side of the spacers 150. In addition, the fourth opening 220H4 shown in FIG. 23 may expose portions of the spacers 150 on both sides of the second surface-modified reference pattern 140B2. That is, the second opening 210H2 and the fourth opening 220H4 may overlap if they were superimposed in their respective locations.

Next, the second mask layer 220A may be removed.

Figure 24:
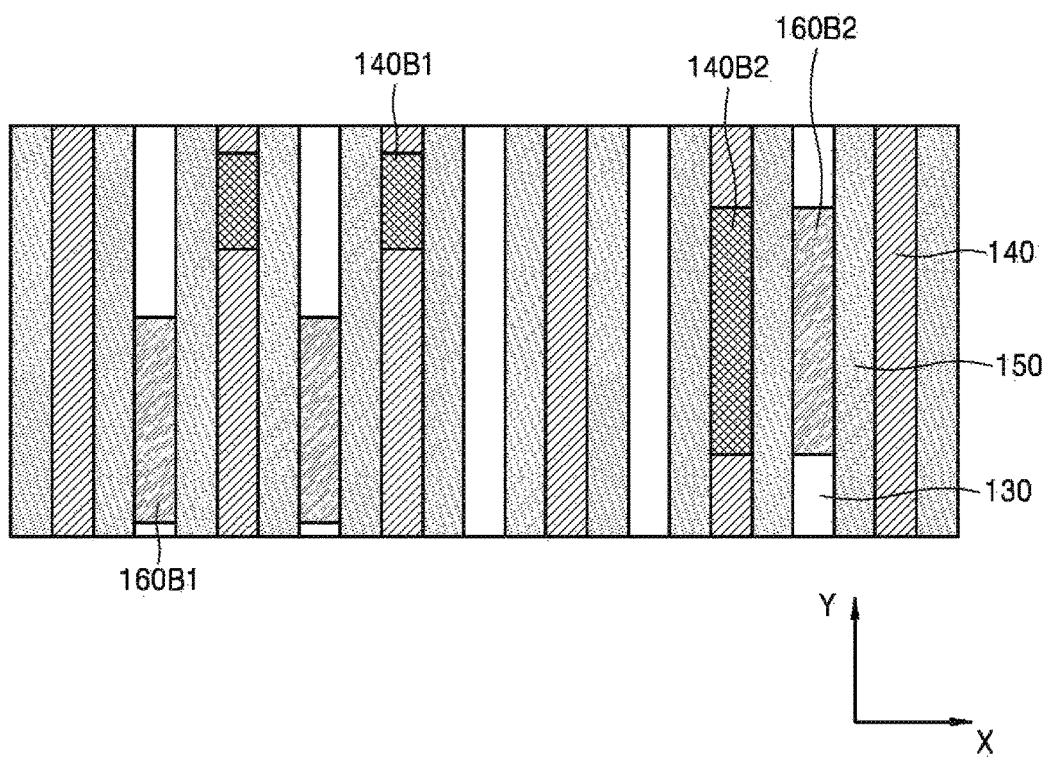
Figure 25:
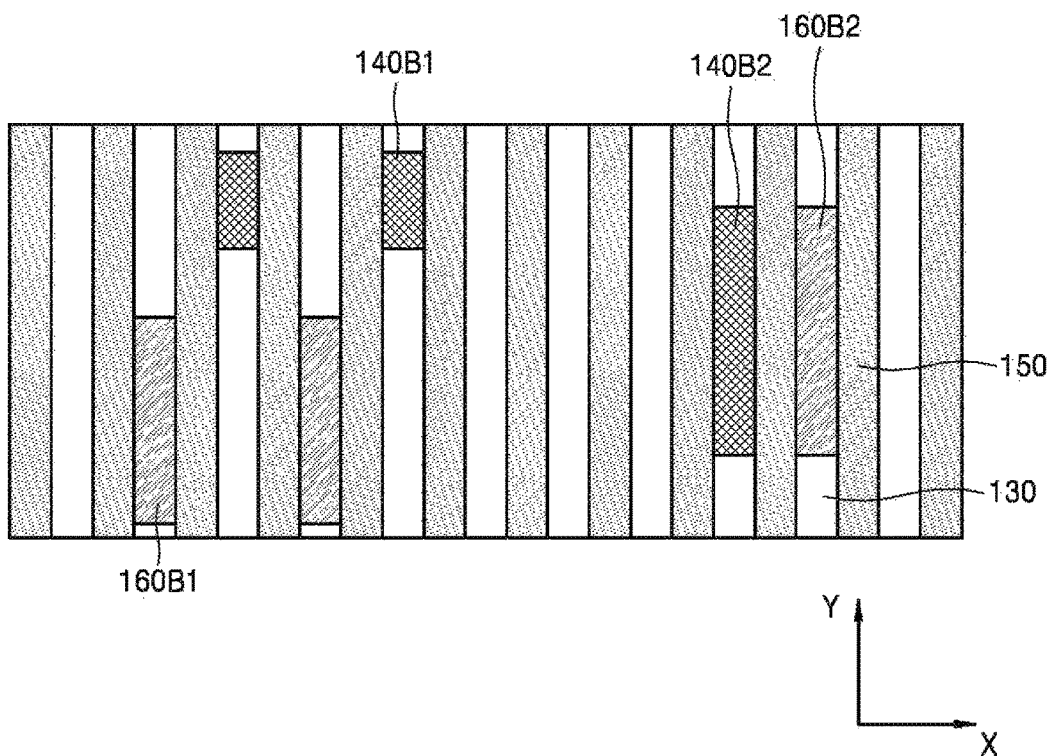

Referring to FIGS. 24 and 25, the plurality of filling patterns 160 may be removed without removing the first and second surface-modified filling patterns 160B 1 and 160B2, and the first and second surface-modified reference patterns 140B1 and 140B2. As a result, the upper surface of the hard mask layer 130 may be exposed again.

Next, the plurality of reference patterns 140 may be removed without removing the first and second surface-modified filling patterns 160B1 and 160B2, and the first and second surface-modified reference patterns 140B 1 and 140B2.

Thus, only the plurality of spacers 150, the first and second surface-modified filling patterns 160B1 and 160B2, and the first and second surface-modified reference patterns 140B1 and 140B2 may remain on the hard mask layer 130.

Processes of removing the plurality of filling patterns 160 and the plurality of reference patterns 140 may be similar to the processes of removing the plurality of filling patterns 160 and the plurality of reference patterns 140 described with reference to FIGS. 11A and 11B.

Figure 26:
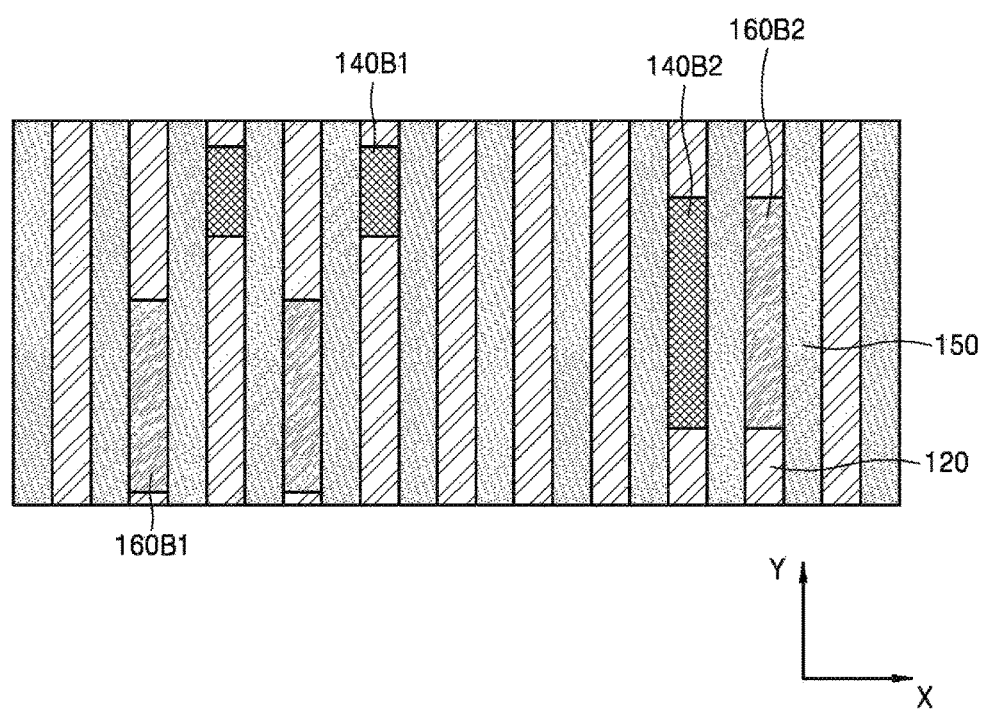
Figure 27:
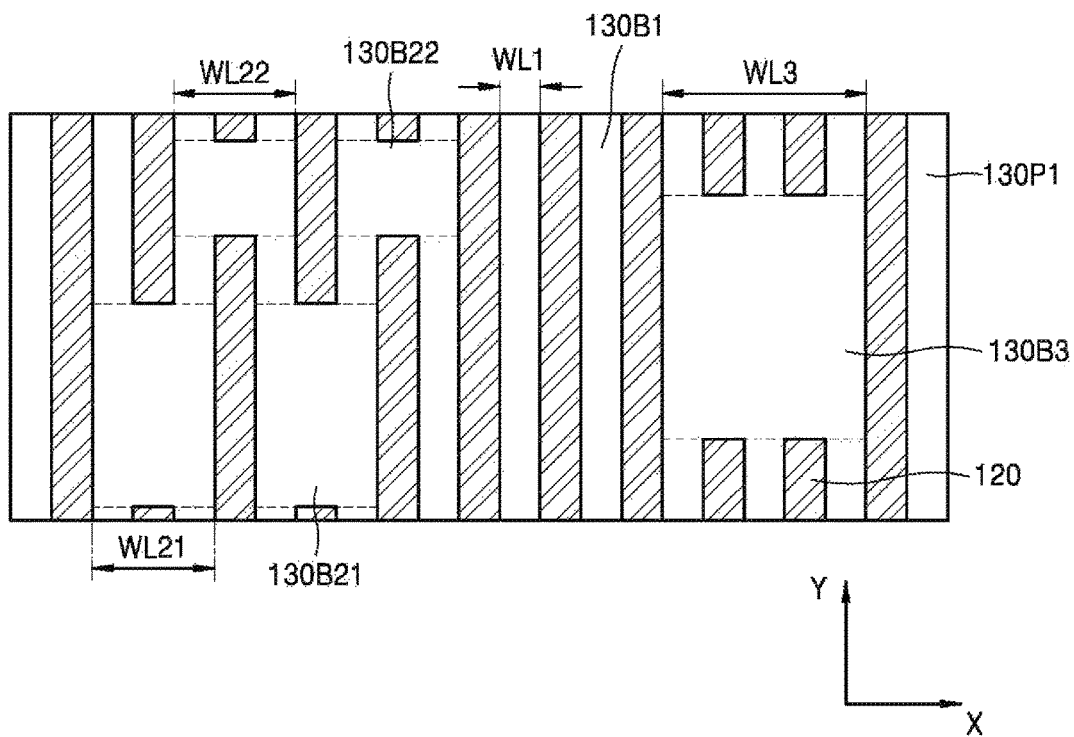

Referring to FIGS. 26 and 27, the hard mask layer 130 is etched using the plurality of spacers 150, the first and second surface-modified filling patterns 160B1 and 160B2, and the first and second surface-modified reference patterns 140B 1 and 140B2 as an etch mask, whereby a hard mask pattern 130P1 may be formed, and an upper surface of the target layer 120 may be exposed.

Next, the plurality of spacers 150, the first and second surface-modified filling patterns 160B1 and 160B2, and the first and second surface-modified reference patterns 140B1 and 140B2 may be removed.

As shown in FIG. 27, the hard mask pattern 130P1 may include a first line pattern region 130B1, second line pattern regions 130B21 and 130B22, and a third line pattern region 130B3.

The first line pattern region 130B1 may be a portion of the hard mask pattern 130P1 formed using the plurality of spacers 150 as an etch mask, and may have a first width WL1 along the X direction.

The second line pattern regions 130B21 and 130B22 may be portions of the hard mask pattern 130P1 formed using the first surface-modified filling pattern 160B1 and the plurality of spacers 150 on both sides of the first surface-modified filling pattern 160B1 as an etch mask, or may be portions of the hard mask pattern 130P1 formed using the first surface-modified reference pattern 140B1 and the plurality of spacers 150 on both sides of the first surface-modified reference pattern 140B1 as an etch mask. The second line pattern regions 130B21 and 130B22 may have second widths WL21 and WL22, which are different from the first width WL1, along the X direction.

The third line pattern region 130B3 may be a portion of the hard mask pattern 130P1 formed using, as an etch mask, the second surface-modified filling pattern 160B2 and the second surface-modified reference pattern 140B2, which are arranged side by side with the plurality of spacers 150 therebetween, and the plurality of spacers 150 on both sides of the second surface-modified filling pattern 160B2 and the second surface-modified reference pattern 140B2. The third line pattern region 130B3 may have a third width WL3, which is different from the first width WL1 and the second widths WL21 and WL22, along the X direction.

In examples of the inventive concept, when the first width WL1 of the first line pattern region 130B1 is 1F, the second widths WL21 and WL22 of the second line pattern regions 130B21 and 130B22 may be 3F, and the third width WL3 of the third line pattern region 130B3 may be 5F. However, the inventive concept is not limited thereto. The widths WL21, WL22 and WL3 of the second and third line pattern regions 130B21, 130B22 and 130B3 may vary depending on positions and arrangements of the surface-modified filling patterns 160B1 and 160B2 and the surface-modified reference patterns 140B1 and 140B2.

Figure 28:
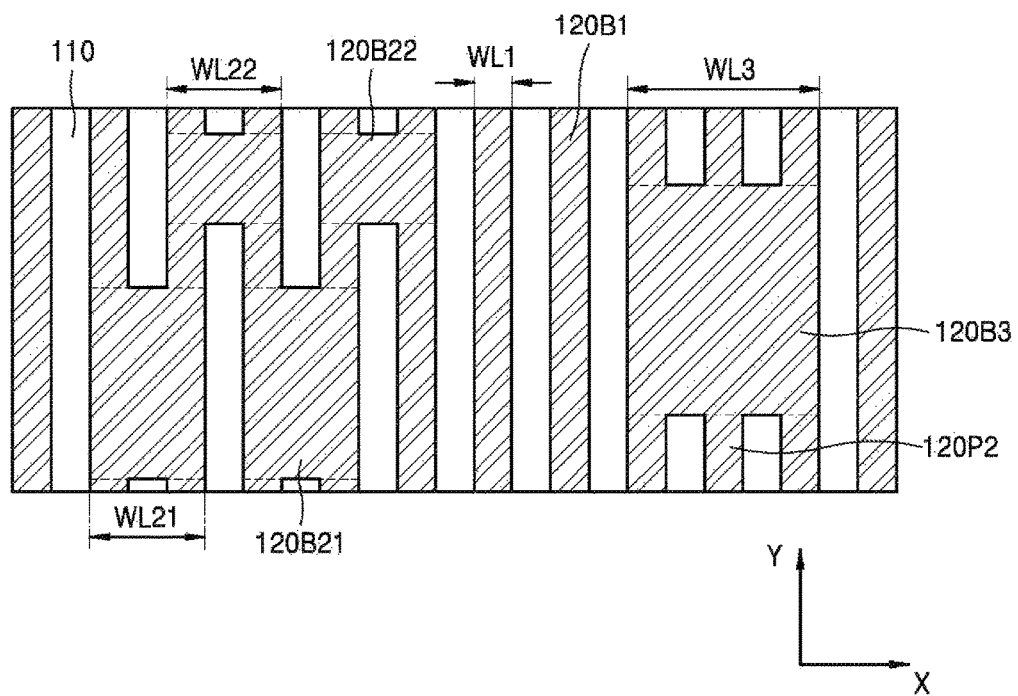

Referring to FIG. 28, a target layer pattern 120P2 may be formed by etching the target layer 120 using the hard mask pattern 130P1 as an etch mask. In a process of forming the target layer pattern 120P2, the target layer 120 which is not covered by the hard mask pattern 130P1 may be removed, and the upper surface of the substrate 110 may be exposed.

The target layer pattern 120P2 may include a plurality of line patterns. The plurality of line patterns may include a first line pattern 120B1, second line patterns 120B21 and 120B22, and a third line pattern 120B3. The first line pattern 120B1 may be formed in a location corresponding to the first line pattern region 130B1 of the hard mask pattern 130P1, and may have the first width WL1 along the X direction. The second line patterns 120B21 and 120B22 may be formed in a location corresponding to the second line pattern regions 130B21 and 130B22 of the hard mask pattern 130P1, and may have the second widths WL21, WL22 along the X direction. The third line pattern 120B3 may be formed in a location corresponding to the third line pattern regions 130B3 of the hard mask pattern 130P1, and may have the third width WL3 along the X direction.

In examples of the inventive concept, when the first width WL1 of the first line pattern 120B1 is 1F, the second widths WL21 and WL22 of the second line patterns 120B21 and 120B22 may be 3F, and the third width WL3 of the third line pattern 120B3 may be 5F. However, the inventive concept is not limited thereto.

According to the method of fabricating the semiconductor described above, the first and second surface treatments S110 and S120 are performed in a DPT process, whereby a plurality of line patterns having different widths can be simultaneously formed. Therefore, since there is no need of separately performing a photolithography process and a DPT process in order to form a plurality of line patterns having different widths, fabrication processes can be simplified, and fabrication costs can be reduced.

Although the inventive concept has been particularly shown and described with reference to several examples, it will be understood that various changes in form and details may be made to such examples without departing from the spirit and scope of the inventive concept as defined by the following claims.

What is claimed is:

1. A method of fabricating a semiconductor device, the method comprising:
   forming a target layer on a substrate;
   forming a plurality of reference patterns on the target layer, wherein the reference patterns are spaced at uniform intervals from one another;
   forming a plurality of spacers covering both side surfaces of each of the reference patterns;
   forming a plurality of filling patterns filling spaces between the spacers;
   performing a first surface treatment on a portion of the plurality of filling patterns to form a surface-modified filling pattern;
   performing a second surface treatment on a portion of the plurality of reference patterns to form a surface-modified reference pattern; and
   removing the plurality of filling patterns and the plurality of reference patterns without removing the surface-modified filling pattern and the surface-modified reference pattern.

2. The method according to claim 1, wherein the forming of the surface-modified filling pattern comprises:
   forming a first mask covering the plurality of filling patterns, the plurality of spacers, and the plurality of reference patterns, the first mask having a first opening which exposes the portion of the plurality of filling patterns; and
   densifying at least an upper part of the portion of the plurality of filling patterns exposed by the first opening.

3. The method according to claim 1, wherein the first surface treatment is an ion implantation process comprising implanting silicon (Si), germanium (Ge), or metal ions into the portion of the plurality of filling patterns exposed by the first opening.

4. The method according to claim 1, wherein the first surface treatment is a plasma process of forming a plasma from at least one of argon (Ar), nitrogen ($N_2$), helium (He), krypton (Kr), and xenon (Xe), and subjecting the portion of the plurality of filling patterns exposed by the first opening to the plasma.

5. The method according to claim 1, wherein the plurality of filling patterns comprises a spin on hardmask (SOH) or an amorphous carbon layer (ACL), and
   the surface-modified filling pattern comprises a densified SOH or a densified ACL.

6. The method according to claim 5, wherein the surface-modified filling pattern comprises a densified SOH or a densified ACL comprising silicon (Si), germanium (Ge), or metal atoms.

7. The method according to claim 1, wherein the surface-modified filling pattern has an etch selectivity with respect to the plurality of filling patterns.

8. The method according to claim 1, wherein the forming of the surface-modified reference pattern comprises:
   forming a second mask covering the plurality of filling patterns, the plurality of spacers, and the plurality of reference patterns, the second mask having a second opening which exposes the portion of the plurality of reference patterns; and
   nitriding the portion of the plurality of reference patterns exposed by the second opening.

9. The method according to claim 1, wherein the second surface treatment is a plasma process comprising forming a plasma from at least one of ammonia (NH$_3$), nitrogen oxide (N$_2$O), oxygen (O$_2$), and carbon monoxide (CO), and subjecting the portion of the plurality of reference patterns exposed by the second opening to the plasma.

10. The method according to claim 1, wherein the second surface treatment is an ion implantation process comprising implanting nitrogen ions into the portion of the plurality of reference patterns exposed by the second opening.

11. The method according to claim 1, wherein the plurality of reference patterns comprise amorphous silicon, and
the surface-modified reference pattern comprises silicon nitride or silicon oxynitride.

12. The method according to claim 1, wherein the surface-modified reference pattern has an etch selectivity with respect to the plurality of reference patterns.

13. The method according to claim 1, wherein the removing of the plurality of filling patterns and the plurality of reference patterns comprises:
removing the plurality of filling patterns without removing the surface-modified filling pattern, the surface-modified reference pattern, and the plurality of spacers,
by a separate process, removing the plurality of reference patterns without removing the surface-modified filling pattern, the surface-modified reference pattern, and the plurality of spacers.

14. The method according to claim 1, wherein, in the removing of the plurality of filling patterns and the plurality of reference patterns, an upper surface of the target layer is exposed,
the method further comprising:
forming a target layer pattern by patterning the target layer using the plurality of spacers, the surface-modified filling pattern, and the surface-modified reference pattern as an etch mask.

15. The method according to claim 14, wherein the target layer pattern has a first line pattern space and a second line pattern space which are spaced apart from each other by a first line separation pattern, and a first line pattern space and a second line pattern space which are spaced apart from each other by a second line separation pattern.

16. The method according to claim 15, wherein the first line pattern space and the second line pattern space which are spaced apart by the first line separation pattern are both located in a first region of the target layer pattern located, as viewed in plan, between side surfaces of two neighboring ones of the spacers, and
the first line pattern space and the second line pattern space which are spaced apart by the second line separation pattern are both located in a second region of the target layer pattern located, as viewed in plan, between side surfaces of two neighboring ones of the spacers.

17. The method according to claim 16, wherein, in the forming of the target layer pattern, the first and second line separation patterns are formed in portions of the target layer covered by the surface-modified filling pattern and the surface-modified reference pattern, respectively.

18. A method of fabricating a semiconductor device, the method comprising:
forming a plurality of reference patterns on an upper surface of an etch target, wherein the reference patterns are spaced apart from each other in a first direction parallel to the upper surface of the etch target and such that each of the reference patterns has opposite side surfaces in the first direction;
forming a plurality of spacers on the plurality of reference patterns, wherein the spacers cover the side surfaces of the reference patterns, respectively, and such that spaces are left between respective ones of the spacers adjacent to one another in the first direction;
forming a plurality of filling patterns in the spaces between said respective ones of the spacers such that a respective pair of the spacers is located on opposite sides of each of the filling patterns in the first direction;
selectively treating one portion of said filling and reference patterns to form at least one modified pattern spanning respective parts of two of the spacers adjacent to each other in the first direction;
removing a portion of the filling patterns and the reference patterns which was not treated to form said at least one modified pattern, without removing the spacers and each said at least one modified pattern; and
subsequently etching the etch target using the spacers and each said at least one modified pattern together as an etch mask.

19. The method according to claim 18, wherein the selective treating of said one portion of the patterns comprises:
altering each of at least one of reference the patterns, at a portion of the reference pattern spanning parts of the spacers covering opposite sides of the reference pattern, by selectively treating the plurality of reference patterns to thereby convert said portion of the reference pattern into a modified reference pattern; and
altering each of at least one of the filling patterns, at a portion of the filling pattern spanning parts of the respective spacers located on opposite sides of the filling pattern, by selectively treating the plurality of filling patterns and to thereby convert said portion of the filling pattern into a modified filling pattern, and
wherein the etch target is etched using the spacers and the modified reference and filling patterns together as the etch mask.

20. A method of fabricating a semiconductor device, the method comprising:
forming a plurality of linear reference patterns on an upper surface of an etch target using a photolithography process, wherein the linear reference patterns are spaced apart from each other in a first direction and each of the linear reference patterns extends longitudinally in a second direction perpendicular to the first direction such that each of the reference patterns has opposite side surfaces in the first direction;
forming linear spacers that extend along the side surfaces of the reference patterns, respectively, and such that each of the linear spacers extends longitudinally in the second direction and spaces are left between respective ones of the spacers adjacent to one another in the first direction;
forming linear filling patterns within said spaces, respectively, and such that the each of the linear filling patterns extends longitudinally in the second direction,
wherein the linear spacers together constitute a first line and space pattern whose spaces are occupied by the linear reference and filling patterns, and the linear reference patterns and the linear filling patterns together constitute a second line and space pattern whose spaces are occupied by the linear spacers;
selectively treating a portion of the second line and space pattern to form at least one modified pattern that spans respective parts of two of the spacers adjacent to one another in the first direction;
removing those portions of the linear filling patterns and the linear reference patterns which have not been treated to form said at least one modified pattern, without removing the linear spacers and each said at least one modified pattern; and subsequently etching the etch target using the linear spacers and the at least one modified pattern together as an etch mask to form a target pattern in which linear spaces aligned in the second direction are separated by a portion of the target pattern.

\* \* \* \* \*